(12) United States Patent
Sethuraman et al.

(10) Patent No.: US 10,949,122 B2
(45) Date of Patent: *Mar. 16, 2021

(54) WRITE MANAGEMENT FOR INCREASING NON-VOLATILE MEMORY RELIABILITY

(71) Applicant: International Business Machines Corporation, Armonk, NY (US)

(72) Inventors: Saravanan Sethuraman, Bangalore (IN); Venkata K. Tavva, Hyderabad (IN); Adam J. McPadden, Essex Junction, VT (US); Hillery Hunter, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/417,486

(22) Filed: May 20, 2019

(65) Prior Publication Data

US 2019/0339909 A1 Nov. 7, 2019

Related U.S. Application Data

(63) Continuation of application No. 15/970,734, filed on May 3, 2018, now Pat. No. 10,379,784.

(51) Int. Cl.
*G06F 12/00* (2006.01)
*G06F 3/06* (2006.01)
(Continued)

(52) U.S. Cl.
CPC .......... *G06F 3/0659* (2013.01); *G06F 3/0619* (2013.01); *G06F 3/0653* (2013.01);
(Continued)

(58) Field of Classification Search
CPC .... G06F 3/0659; G06F 3/0619; G06F 3/0653; G06F 3/0673; G06F 12/0238; G06F 12/0246; G11C 11/161
See application file for complete search history.

(56) References Cited

U.S. PATENT DOCUMENTS 7,859,894 B2 12/2010 Happ et al.
8,811,071 B2 8/2014 Alam et al.
(Continued)

FOREIGN PATENT DOCUMENTS

WO 2017052542 A1 3/2017

OTHER PUBLICATIONS

List of IBM Patents or Patent Applications Treated As Related.
(Continued)

*Primary Examiner* — Shawn X Gu
(74) *Attorney, Agent, or Firm* — Zilka-Kotab, P.C.

(57) ABSTRACT

A computer-implemented method, according to one embodiment, includes: determining a current temperature associated with an intended storage location in memory for data in a write request, determining a percentage of first logical states included in a binary representation of the data in the received write request, selecting a write management operation in response to determining that the current temperature associated with the intended storage location is outside a predetermined range, and sending one or more instructions to perform the write management operation. Moreover, the write management operation corresponds to the determined percentage of first logical states included in the binary representation. Other systems, methods, and computer program products are described in additional embodiments.

20 Claims, 14 Drawing Sheets

(Continued)

(51) Int. Cl.
*G06F 12/02* (2006.01)
*G11C 7/04* (2006.01)
*G11C 16/26* (2006.01)
*G11C 16/08* (2006.01)
*G11C 16/34* (2006.01)
*G11C 11/16* (2006.01)
*G11C 16/10* (2006.01)
*G11C 16/32* (2006.01)

(52) U.S. Cl.
CPC ........ *G06F 3/0673* (2013.01); *G06F 12/0238* (2013.01); *G06F 12/0246* (2013.01); *G11C 7/04* (2013.01); *G11C 11/1653* (2013.01); *G11C 11/1675* (2013.01); *G11C 11/1693* (2013.01); *G11C 16/08* (2013.01); *G11C 16/10* (2013.01); *G11C 16/26* (2013.01); *G11C 16/32* (2013.01); *G11C 16/3418* (2013.01); *G11C 11/161* (2013.01)

(56) References Cited

U.S. PATENT DOCUMENTS

| | | | |
|---|---|---|---|
| 9,142,277 | B2 | 9/2015 | Kim et al. |
| 9,330,790 | B2 | 5/2016 | Kim et al. |
| 9,406,368 | B2 | 8/2016 | Bose et al. |
| 9,431,084 | B2 | 8/2016 | Bose et al. |
| 9,489,146 | B2 | 11/2016 | Erez |
| 9,619,166 | B2 | 4/2017 | Bickelman et al. |
| 9,734,885 | B1 * | 8/2017 | Healy .................. G06F 1/206 |
| 9,761,294 | B1 | 9/2017 | Healy et al. |
| 10,379,784 | B1 * | 8/2019 | Sethuraman ........ G06F 12/0238 |

OTHER PUBLICATIONS

Mertens, R., "Seagate demonstrate an MRAM-powered high performance SSD boot drive," MRAM-info, Aug. 2017, pp. 1-2 retrieved from https://www.mram-info.com/seagate-demonstrate-mram-powered-high-performance-ssd-boot-drive.

Hruska, J., "Everspin unveils MRAM SSDs aimed at the storage accelerator market," ExtremeTech, Mar. 9, 2017, pp. 1-11 retrieved from https://www.extremetech.com/computing/245592-everspin-announces-new-commercial-mram-ssds-aimed-storage-accelerator-market.

Sliwa, C., "Everspin Technologies nvNITRO ST-MRAM SSDs ready to ship," TechTarget, Sep. 14, 2017, pp. 1-7 retrieved from https://searchstorage.techtarget.com/news/450426353/Everspin-Technologies-ready-to-ship-nvNITRO-ST-MRAM-SSDs.

Wang et al., "MTJ Variation Monitor-assisted Adaptive MRAM Write," ACM, DAC'16, Jun. 5-9, 2016, pp. 1-6.

Nigam et al., "Delivering on the promise of universal memory for spin-transfer torque RAM (STT-RAM)," International Symposium on Low Power Electronics and Design (ISLPED), Aug. 2011, pp. 121-126.

Sethuraman et al., U.S. Appl. No. 15/970,734, filed May 3, 2018.

Notice of Allowance from U.S. Appl. No. 15/970,734, dated Apr. 3, 2019.

* cited by examiner

WRITE MANAGEMENT FOR INCREASING NON-VOLATILE MEMORY RELIABILITY

BACKGROUND

The present invention relates to data storage systems, and more particularly, this invention relates to improving the reliability and performance of magnetoresistive random access memory (MRAM).

Using MRAM as an example, the performance characteristics of conventional MRAM-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

However, in MRAM-based SSDs, memory locations are erased in blocks prior to being written to. The size of an erase block unit is typically 256 pages and the erase operations takes approximately one order of magnitude more time than a page program operation. Due to the intrinsic properties of MRAM, MRAM-based SSDs write data out-of-place whereby a mapping table maps logical addresses of the written data to physical addresses. This mapping table is typically referred to as the Logical-to-Physical Table (LPT).

As MRAM-based memory cells exhibit read errors and/or failures due to wear or other reasons, additional redundancy may be used within memory pages as well as across memory chips (e.g., RAID-5 and RAID-6 like schemes). The additional redundancy within memory pages may include error correction code (ECC) which, for example, may include Bose-Chaudhuri-Hocquenghem (BCH) codes. While the addition of ECC in pages is relatively straightforward, the organization of memory blocks into RAID-like stripes is more complex. For instance, individual blocks are retired over time which requires either reorganization of the stripes, or capacity reduction of the stripe. As the organization of stripes together with the LPT defines the placement of data, SSDs typically utilize a Log-Structured Array (LSA) architecture, which combines these two methods.

Again, the LSA architecture implements on out-of-place writes. Accordingly, a memory page overwrite will result in writing the memory page data to a new location in memory, marking the old copy of the memory page data as invalid, and then updating the mapping information. Due to the limitations of current NAND memory technology, an invalidated data location cannot be reused until the entire block it belongs to has been erased. Before erasing, though, the block undergoes garbage collection, whereby any valid data in the block is relocated to a new block. Garbage collection of a block is typically deferred for as long as possible to maximize the amount of invalidated data in block, and thus reduce the number of valid pages that are relocated, as relocating data causes additional write operations, and thereby increases write amplification.

Moreover, the amount of energy involved with performing a write operation on an MRAM-based SSD is notably higher than the amount of energy involved with performing a read operation on the same MRAM-based SSD. Accordingly, the number of write operations performed by a given storage system implementing MRAM-based SSDs may have a significant effect on the amount of energy consumed by the system. Moreover, the processes involved with writing certain types of data may also have an effect on the amount of energy consumed by the storage system, as well as the reliability (e.g., security) of the data stored therein.

SUMMARY

A computer-implemented method, according to one embodiment, includes: determining a current temperature associated with an intended storage location in memory for data in a write request, determining a percentage of first logical states included in a binary representation of the data in the received write request, selecting a write management operation in response to determining that the current temperature associated with the intended storage location is outside a predetermined range, and sending one or more instructions to perform the write management operation. Moreover, the write management operation corresponds to the determined percentage of first logical states included in the binary representation.

A computer program product, according to another embodiment, includes a computer readable storage medium having program instructions embodied therewith. The program instructions are readable and/or executable by a controller to cause the controller to perform a method comprising: determining, by the controller, a current temperature associated with an intended storage location in memory for data in a write request; determining, by the controller, a percentage of first logical states included in a binary representation of the data in the received write request; selecting, by the controller, a write management operation in response to determine that the current temperature associated with the intended storage location is outside a predetermined range; and sending, by the controller, one or more instructions to perform the write management operation. Again, the write management operation corresponds to the determined percentage of first logical states included in the binary representation.

A system, according to yet another embodiment, includes: a processor; and logic integrated with the processor, executable by the processor, or integrated with and executable by the processor, the logic being configured to: determine, by the processor, a current temperature associated with an intended storage location in memory for data in a write request; determine, by the processor, a percentage of first logical states included in a binary representation of the data in the received write request; select, by the processor, a write management operation in response to determining that the current temperature associated with the intended storage location is outside a predetermined range; and send, by the processor, one or more instructions to perform the write management operation. Moreover, the write management operation corresponds to the determined percentage of first logical states included in the binary representation.

Other aspects and embodiments of the present invention will become apparent from the following detailed description, which, when taken in conjunction with the drawings, illustrate by way of example the principles of the invention.

DETAILED DESCRIPTION

Figure 1:
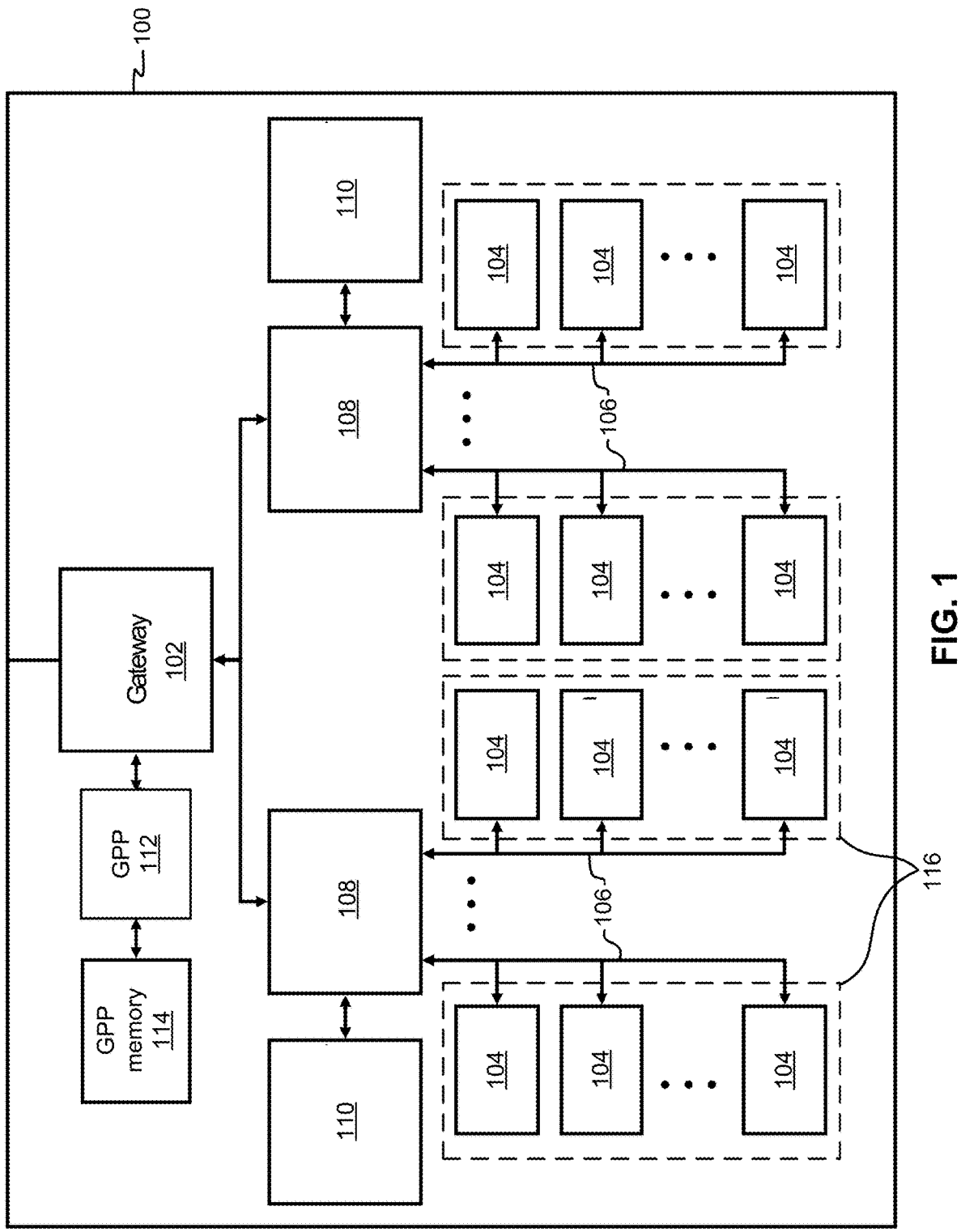
FIG. 1 is a partial schematic diagram of a non-volatile memory module, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a", "an" and "the" include plural referents unless otherwise specified. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof for improving efficiency thereof. Utilizing temperature information corresponding to the physical storage components in memory, as well as the logical content of write requests, allows some of the approaches herein to increase the reliability of memory subsystems which implement memory technologies which have asymmetric write and read energies, e.g., as will be described in further detail below.

It should be appreciated that various embodiments herein may be implemented with a wide range of memory mediums, including for example non-volatile RAM (NVRAM) technologies such as spin-transfer torque RAM (STT-RAM), phase-change memory (PCM), magnetoresistive RAM (MRAM), etc. However, to provide a context and assist the reader, various embodiments included herein may be described with reference to a specific type of non-volatile memory. This has been done by way of example only, and should not be deemed limiting on the invention.

In one general embodiment, a computer-implemented method includes: receiving a write request, determining an intended storage location in memory for data in the received write request, determining a current temperature associated with the intended storage location, determining a percentage of first logical states included in a binary representation of the data in the received write request, selecting a write management operation in response to determining that the current temperature associated with the intended storage location is outside a predetermined range, and sending one or more instructions to perform the write management operation. Moreover, the write management operation corresponds to the determined percentage of first logical states included in the binary representation.

In another general embodiment, a computer program product includes a computer readable storage medium having program instructions embodied therewith. The computer readable storage medium is not a transitory signal per se. Moreover, the program instructions readable and/or executable by a controller to cause the controller to perform a method which includes: receiving, by the controller, a write request; determining, by the controller, an intended storage location in memory for data in the received write request; determining, by the controller, a current temperature associated with the intended storage location; determining, by the controller, a percentage of first logical states included in a binary representation of the data in the received write request; selecting, by the controller, a write management operation in response to determining that the current temperature associated with the intended storage location is outside a predetermined range; and sending, by the controller, one or more instructions to perform the write management operation. Again, the write management operation corresponds to the determined percentage of first logical states included in the binary representation.

In yet another general embodiment, a system includes: a processor; and logic integrated with the processor, executable by the processor, or integrated with and executable by the processor, the logic being configured to: receive, by the processor, a write request; determine, by the processor, an intended storage location in memory for data in the received write request; determine, by the processor, a current temperature associated with the intended storage location; determine, by the processor, a percentage of first logical states included in a binary representation of the data in the received write request; select, by the processor, a write management operation in response to determining that the current temperature associated with the intended storage location is outside a predetermined range; send, by the processor, one or more instructions to perform the write management operation; determine, by the processor, whether an updated temperature associated with the intended storage location is outside the predetermined range; and send, by the processor, one or more instructions to perform the write request in response to determining that the current temperature associated with the intended storage location is not outside the predetermined range. Moreover, the write management operation corresponds to the determined percentage of first logical states included in the binary representation.

FIG. 1 illustrates a memory module 100, in accordance with one embodiment. It should be noted that although memory module 100 is depicted as an exemplary non-volatile data storage module in the present embodiment, various other types of non-volatile data storage modules may be used in a data storage system according to alternate embodiments. It follows that the architecture and/or components of memory module 100 are in no way intended to limit the invention, but rather have been presented as a non-limiting example.

Moreover, as an option, the present memory module 100 may be implemented in conjunction with features from any other embodiment listed herein, such as those described with reference to the other FIGS. However, such memory module 100 and others presented herein may be used in various applications and/or in permutations which may or may not be specifically described in the illustrative embodiments listed herein. Further, the memory module 100 presented herein may be used in any desired environment.

With continued reference to FIG. 1, memory module 100 includes a gateway 102, a general purpose processor (GPP) 112 (such as an ASIC, FPGA, CPU, etc.) connected to a GPP memory 114 (which may include RAM, ROM, battery-backed DRAM, phase-change memory PC-RAM, MRAM, STT-MRAM, etc., or a combination thereof), and a number of memory controllers 108. Each memory controller 108 is connected to a plurality of MRAM modules 104 (e.g., memory circuits) via channels 106. Moreover, subsets of the MRAM modules 104 are arranged to form DIMMs 116. Depending on the approach, the NVM based DIMMs may be implemented in a DDR interface, an OpenCAPI interface, a Peripheral Component Interconnect Express (PCIe) interface, or any other differential interface. However, it should be noted that the various MRAM modules 104 may be any other type(s) of non-volatile memory in other approaches.

According to various embodiments, one or more of the controllers 108 may be and/or include one or more processors, and/or any logic for controlling any subsystem of the memory module 100. For example, the controllers 108 typically control the functions of MRAM modules 104, e.g., such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, one or more of the controllers 108 may be configured and/or programmable to perform or control some or all of the methodology presented herein. Thus, one or more of the controllers 108 may be considered to be configured to perform various operations by way of logic programmed into one or more chips, modules, blocks, etc.; software, firmware, other instructions being available to one or more processors, etc.; etc., and/or combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
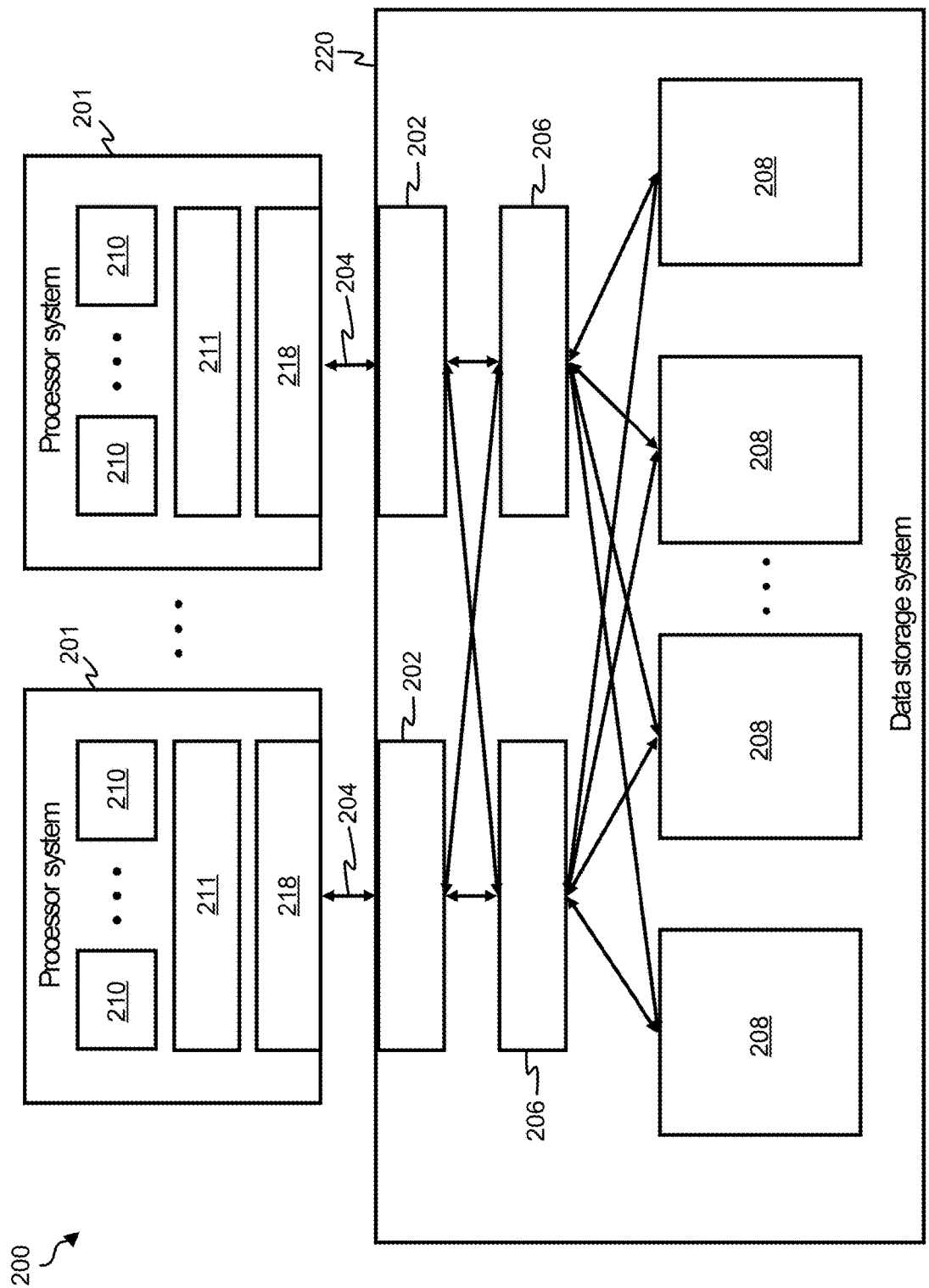
FIG. 2 is a partial schematic diagram of a data storage system architecture, in accordance with one embodiment.

As previously mentioned, memory module 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1. Thus, some of the components included in FIG. 2 may have common numbering with components included in FIG. 1.

Looking to FIG. 2, the data storage system 220 includes a number of interface modules 202, each of which is configured to communicate with one or more processor systems 201 via (e.g., using) I/O interconnections 204. The data storage system 220 may also include one or more RAID controllers 206 which are configured to control data storage in a plurality of non-volatile data storage modules 208. According to one approach, the non-volatile data storage modules 208 may include MRAM modules (e.g., see 104 in FIG. 1). However, in other approaches, one or more of the non-volatile data storage modules 208 may include Flash memory modules, RAM, ROM, and/or some other known type of non-volatile memory.

The I/O interconnections 204 may include any known communication protocols, e.g., such as Fiber Channel (FC), FC over Ethernet (FCoE), Infiniband, Internet Small Computer System Interface (iSCSI), Transport Control Protocol/Internet Protocol (TCP/IP), PCIe, etc., and/or any combination thereof. Moreover, the RAID controller(s) 206 in the data storage system 220 may perform a parity scheme similar to that employed by RAID-5, RAID-10, or some other suitable parity scheme, as would be understood by one of skill in the art upon reading the present descriptions.

Each processor system 201 includes one or more processors 210 (such as CPUs, microprocessors, etc.), local data storage 211 (e.g., such as RAM 1114 of FIG. 11, ROM 1116 of FIG. 11, etc.), and an I/O adapter 218 which may be configured to communicate with the data storage system 220 via I/O interconnections 204 as mentioned above.

Referring momentarily back to FIG. 1, memory controllers 108 and/or other controllers described herein (e.g., RAID controllers 206 of FIG. 2) may be able to perform various functions on data stored in the memory module 100, e.g., depending on the desired embodiment. Specifically, memory controllers may include logic configured to perform any one or more of the following functions, which are in no way intended to be an exclusive list. The memory controllers may also include logic configured to perform any one or more of the processes included in methods 700, 750 below in some approaches. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, LEBs may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as MRAM, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different ranks and/or dies may be grouped together, such that blocks from the same group can be read or written in parallel, thereby increasing overall bandwidth. It is also possible to combine the previous two methods, and to compose RAID stripes using blocks from different ranks and/or dies that are able to be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat separation.

Heat Separation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the LPT mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat separation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, heat separation may be achieved. In particular, heat segregating methods may group hot memory pages together in certain memory blocks while cold memory pages are grouped together in separate memory blocks. Thus, a heat segregated LEB tends to be occupied by either hot or cold data.

The merit of heat separation is two-fold. First, performing a garbage collection process on a hot memory block will prevent triggering the relocation of cold data as well. In the absence of heat separation, updates to hot data, which are performed frequently, also results in the undesirable relocations of all cold data collocated on the same LEB as the hot data being relocated. Therefore, the write amplification incurred by performing garbage collection is much lower for embodiments implementing heat separation.

Secondly, the relative heat of data can be utilized for wear leveling purposes. For example, hot data may be placed in healthier (e.g., younger) memory blocks, while cold data may be placed on less healthy (e.g., older) memory blocks relative to those healthier memory blocks. Thus, the rate at which relatively older blocks are exposed to wear is effectively slowed, thereby improving the overall endurance of a given data storage system implementing heat separation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Figure 3:
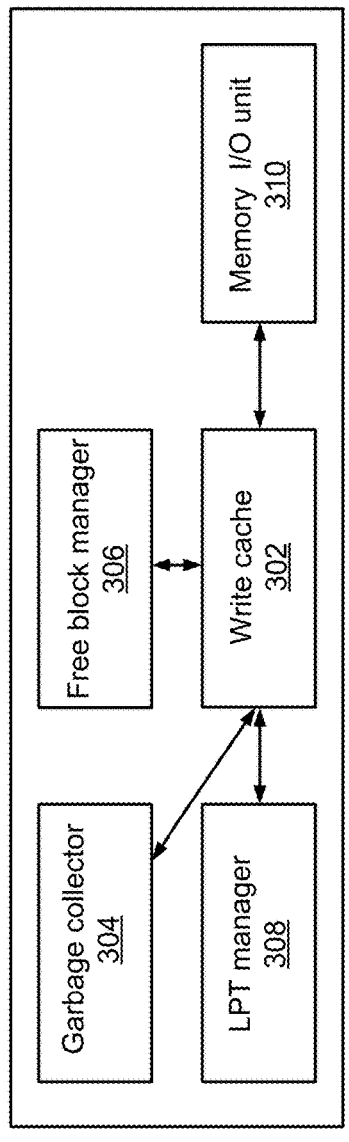
FIG. 3 is a representational diagram of a data storage system, in accordance with one embodiment.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages in memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4:
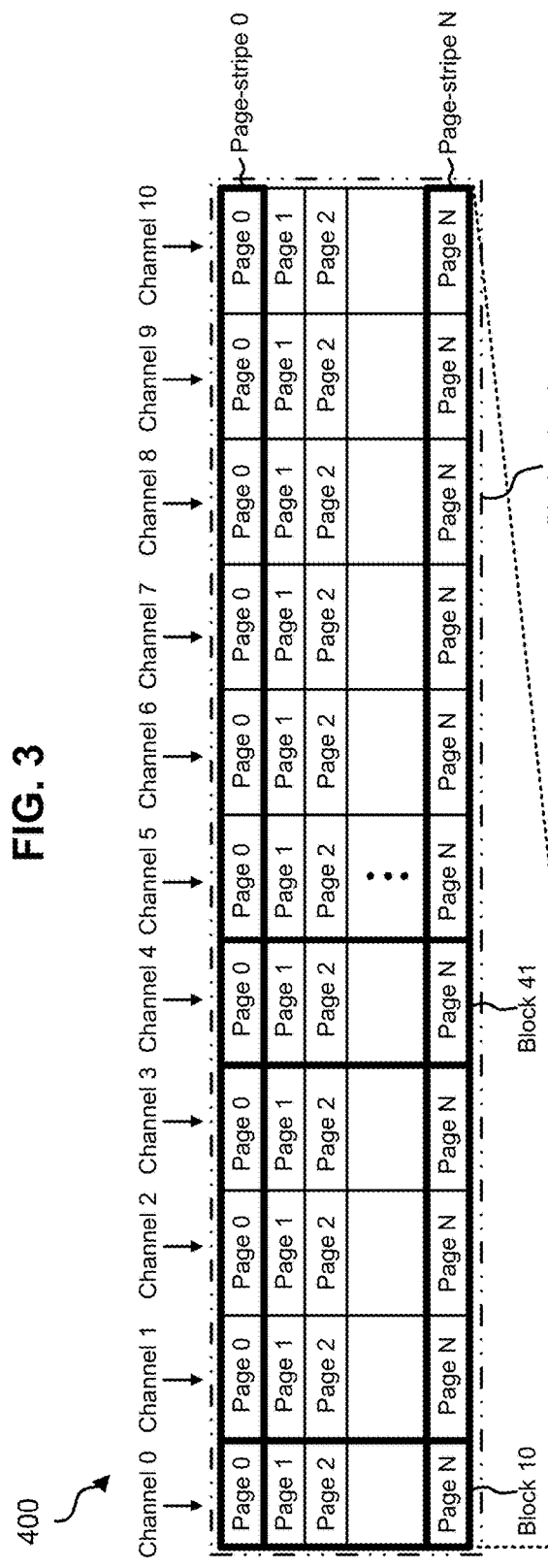
FIG. 4 is a conceptual diagram which includes a block-stripe and page-stripe, in accordance with one embodiment.

To better understand the distinction between block-stripes and page-stripes as used herein, FIG. 4 is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4 may be implemented in a cache architecture. However, depending on the desired embodiment, the conceptual diagram 400 of FIG. 4 may be implemented in defining the organization of data stored in non-volatile memory. Accordingly, both implementations are described in turn below.

Non-Volatile Memory

Looking now to FIG. 4, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel may form a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4 is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 256 pages, but could include more or less in various embodiments. Analogously, the number of channels per plane and/or the number of planes may vary depending on the desired embodiment.

Referring still to FIG. 4, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 5A:
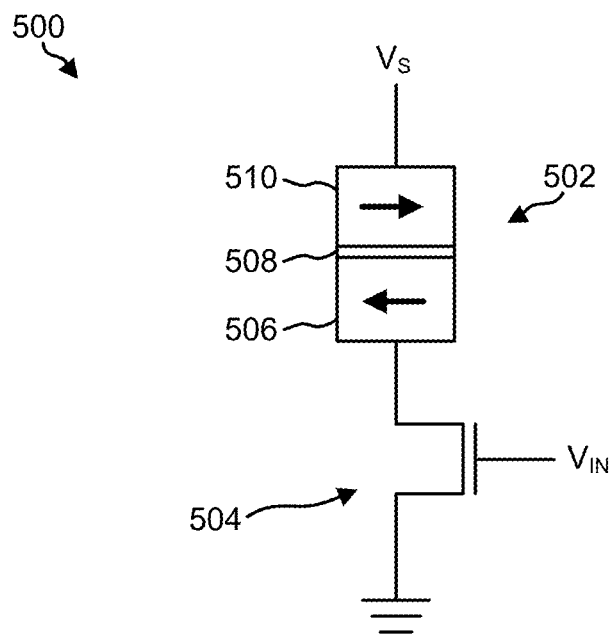
FIG. 5A is a partial schematic view of a MRAM cell, in accordance with one embodiment.

As the name suggests, MRAM modules (e.g., see 104 in FIG. 1) store a binary representation of data by influencing the magnetic orientation of a free layer in each of a plurality of memory cells included in the MRAM modules. The magnetic orientation of the free layer may have one of two orientations, each of which represents a logical "1" or a logical "0". Referring now to FIG. 5A, a partial schematic view of a single MRAM cell 500 is illustrated in accordance with one embodiment. As an option, the present MRAM cell 500 may be implemented in conjunction with features from any other embodiment listed herein, such as those described with reference to the other FIGS., such as FIGS. 1-4. However, such MRAM cell 500 and others presented herein may be used in various applications and/or in permutations which may or may not be specifically described in the illustrative embodiments listed herein. Further, the MRAM cell 500 presented herein may be used in any desired environment. Thus FIG. 5A (and the other FIGS.) may be deemed to include any possible permutation.

As shown, the MRAM cell 500 includes a magnetic tunnel junction (MTJ) sensor stack 502 portion, as well as a transistor 504 portion. Moreover, a supply voltage Vs is coupled to a first end of the MTJ sensor stack 502, while one of the terminals of the transistor 504 is coupled to a second end of the MTJ sensor stack 502. The other two terminals of the transistor 504 are coupled to ground and an input voltage VIN, respectively. Accordingly, the supply voltage Vs and/or the input voltage VIN may be adjusted such that a current may be selectively passed through the MTJ sensor stack 502, e.g., as will be described in further detail below.

Looking now to the MTJ sensor stack 502, a free layer 506 is separated from a reference layer 510 by a tunnel junction layer 508. While the free layer 506 and the reference layer 510 preferably include electrically conductive materials, the tunnel junction layer 508 includes electrically insulative materials, e.g., such as MgO. Thus, the free layer 506 and the reference layer 510 are electrically conducting while the tunnel junction layer 508 is electrically insulative. It should also be noted that, although not shown in FIG. 5A, additional layers may be present in the MTJ sensor stack 502. Moreover, unless otherwise specified, the various layers in this and other embodiments may be formed using conventional processes.

The magnetic orientations of the reference layer 510 and the free layer 506 are oriented along the deposition plane of the layers, and have been represented by arrows positioned inside the respective layers of the MTJ sensor stack 502 in the present embodiment. While the magnetic orientation of the reference layer 510 is fixed in a certain direction along the deposition plane, the magnetic orientation of the free layer 506 may be oriented in one of two antiparallel directions along the deposition plane. As mentioned above, each of the two possible magnetic orientations of the free layer 506 may be used to represent a logical "1" or a logical "0". Thus, each MRAM cell 500 may be used to store a single bit of information by selectively changing the magnetic orientation of the free layer 506 to be positioned in one of the two possible antiparallel directions.

The magnetic orientation of the free layer 506 may be changed between the two possible antiparallel directions by passing a sufficiently strong current through the MTJ sensor stack 502. More specifically, a sufficiently strong electrical current generates a magnetic field which is able to influence the magnetic orientation of the grains included in the free layer 506 into one of the two antiparallel directions, thereby writing a bit of information to the MRAM cell 500. Moreover, the direction in which the current is passed through the MTJ sensor stack 502 determines which of the two antiparallel directions the magnetic orientation of the free layer 506 is set. As will be appreciated by one skilled in the art, although the tunnel junction layer 508 is electrically insulative, electrons are able to tunnel through the tunnel junction layer 508 if it has a sufficiently thin deposition thickness and the voltage potential across the MTJ sensor stack 502 is sufficiently high. As a result, electrical conduction, and thereby electrical current, is achieved across the MTJ sensor stack 502.

Furthermore, the transistor 504 may serve as an electrical switch which is also able to dictate whether current is passed through the MTJ sensor stack 502 of the MRAM cell 500. The transistor 504 may be selectively opened or closed based on the input voltage VIN applied to the base or gate (depending on the type of transistor) terminal of the transistor 504. More specifically, a sufficiently high input voltage VIN may exceed the breakdown voltage of the transistor 504, thereby effectively closing the switch and allowing current to pass through the transistor 504. However, once the input voltage VIN drops below the breakdown voltage, the transistor 504 returns to an open state and current is no longer able to pass therethrough, e.g., as would be appreciated by one skilled in the art.

It follows that a bit of information may be selectively written to the MTJ sensor stack 502 by adjusting the supply voltage VS and/or the input voltage VIN applied to the MRAM cell 500. Accordingly, each of the supply voltage VS and the input voltage VIN are preferably coupled to a respective voltage source and/or one or more controllers which are configured to perform write operations. Furthermore, data may be read from the MRAM cell 500 by sampling the resistance across the MTJ sensor stack 502. However, this may be performed using a current which is sufficiently low, e.g., such that the magnetic field produced is not strong enough to flip the magnetic orientation of the free layer 506.

Figure 5B:
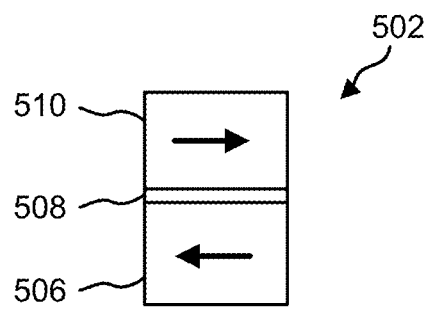
FIG. 5B is a partial representational view of the magnetic orientations for the layers in a sensor stack of the MRAM cell in FIG. 5A, in accordance with one embodiment.
Figure 5C:
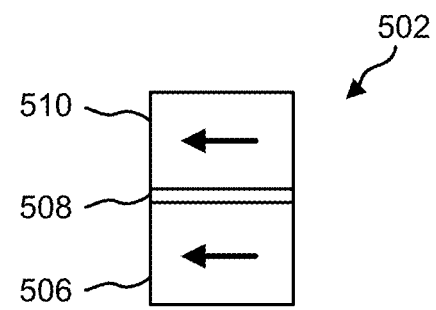
FIG. 5C is a partial representational view of the magnetic orientations for the layers in a sensor stack of the MRAM cell in FIG. 5A, in accordance with one embodiment.

Referring momentarily to FIGS. 5B-5C, representational views of the MTJ sensor stack 502 having two different magnetic orientation schemes are illustrated. Looking first to FIG. 5B, the magnetic orientations of the reference layer 510 and the free layer 506 are in opposite (e.g., antiparallel) directions. This magnetic orientation scheme causes the MTJ sensor stack 502 to have a higher resistance (at least in comparison to the resistance resulting from the magnetic orientation scheme in FIG. 5C), which may signify a logical "1". Looking now to FIG. 5C, the magnetic orientations of the reference layer 510 and the free layer 506 are in the same (e.g., parallel) directions. This magnetic orientation scheme causes the MTJ sensor stack 502 to have a lower resistance (at least in comparison to the resistance resulting from the magnetic orientation scheme in FIG. 5B), which may signify a logical "0".

However, it should be noted that magnetic orientations depicted in FIGS. 5B-5C are in no way intended to be limiting and may differ depending on the approach. For instance, the magnetic orientation scheme illustrated in FIG. 5B may be interpreted as representing a logical "0", while the magnetic orientation scheme illustrated in FIG. 5C may be interpreted as representing a logical "1".

Figure 6A:
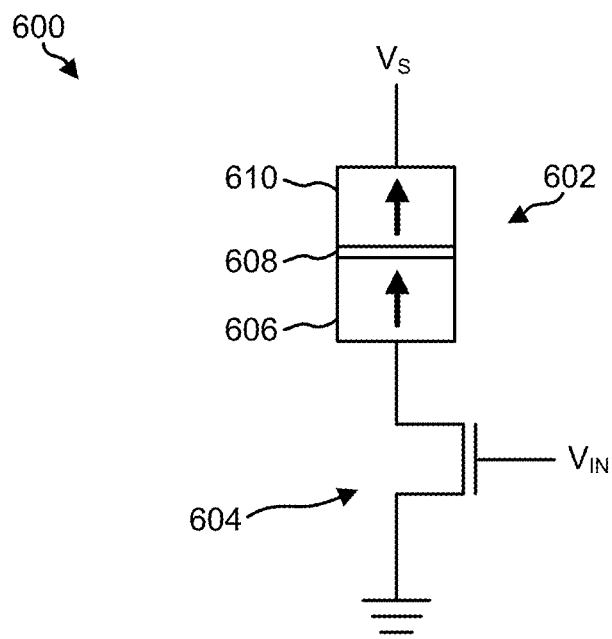
FIG. 6A is a partial schematic view of a MRAM cell, in accordance with one embodiment.

Referring now to FIG. 6A, a partial schematic view of a single MRAM cell 600 is illustrated in accordance with one embodiment. As an option, the present MRAM cell 600 may be implemented in conjunction with features from any other embodiment listed herein, such as those described with reference to the other FIGS., such as FIGS. 1-4. However, such MRAM cell 600 and others presented herein may be used in various applications and/or in permutations which may or may not be specifically described in the illustrative embodiments listed herein. Further, the MRAM cell 600 presented herein may be used in any desired environment. Thus FIG. 6A (and the other FIGS.) may be deemed to include any possible permutation.

As shown, the MRAM cell 600 includes similar components as well as a similar structure as the MRAM cell 500 shown above in FIGS. 5A-5C. Accordingly, the MRAM cell 600 includes a perpendicular MTJ (p-MTJ) sensor stack 602 portion, as well as a transistor 604 portion. Moreover, a supply voltage Vs is coupled to a first end of the p-MTJ sensor stack 602, while one of the terminals of the transistor 604 is coupled to a second end of the p-MTJ sensor stack 602. The other two terminals of the transistor 604 are coupled to ground and an input voltage VIN, respectively. Accordingly, the supply voltage Vs and/or the input voltage VIN may be adjusted such that a current may be selectively passed through the p-MTJ sensor stack 602, e.g., as will be described in further detail below.

Looking now to the p-MTJ sensor stack 602, a free layer 606 is separated from a reference layer 610 by a tunnel junction layer 608. While the free layer 606 and the reference layer 610 preferably include electrically conductive materials, the tunnel junction layer 608 includes electrically insulative materials, e.g., such as MgO. Thus, the free layer 606 and the reference layer 610 are electrically conducting while the tunnel junction layer 608 is electrically insulative. It should also be noted that, although not shown in FIG. 6A, additional layers may be present in the p-MTJ sensor stack 602. Moreover, unless otherwise specified, the various layers in this and other embodiments may be formed using conventional processes.

The magnetic orientations of the reference layer 610 and the free layer 606 are both oriented along the deposition direction of the layers. In other words, the magnetic orientations of the reference layer 610 and the free layer 606 are both oriented perpendicular to the plane of deposition for the p-MTJ sensor stack 602, and have been represented by arrows positioned inside the respective layers in the present embodiment. While the magnetic orientation of the reference layer 610 is fixed in a certain direction along the deposition direction, the magnetic orientation of the free layer 606 may be oriented in one of two antiparallel directions along the deposition direction. As mentioned above, each of the two possible magnetic orientations of the free layer 606 may be used to represent a logical "1" or a logical "0". Thus, each MRAM cell 600 may be used to store a single bit of information by selectively changing the magnetic orientation of the free layer 606 to be positioned in one of the two possible antiparallel directions.

As described above, the magnetic orientation of the free layer 606 may be changed between the two possible antiparallel directions by passing a sufficiently strong current through the p-MTJ sensor stack 602. It follows that a bit of information may be selectively written to the p-MTJ sensor stack 602 by adjusting the supply voltage Vs and/or the input voltage VIN applied to the MRAM cell 600. Accordingly, each of the supply voltage Vs and the input voltage VIN are preferably coupled to a respective voltage source and/or one or more controllers which are configured to perform write operations. Furthermore, data may be read from the MRAM cell 600 by sampling the resistance across the p-MTJ sensor stack 602. However, this may be performed using a current which is sufficiently low, e.g., such that the magnetic field produced is not strong enough to flip the magnetic orientation of the free layer 606.

Figure 6B:
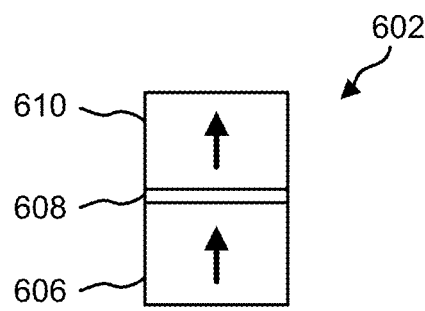
FIG. 6B is a partial representational view of the magnetic orientations for the layers in a sensor stack of the MRAM cell in FIG. 6A, in accordance with one embodiment.
Figure 6C:
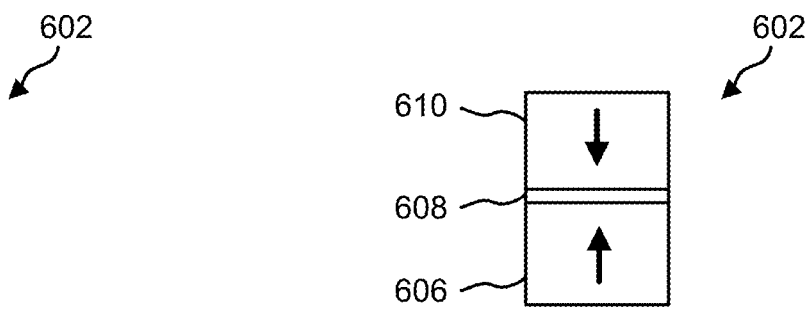
FIG. 6C is a partial representational view of the magnetic orientations for the layers in a sensor stack of the MRAM cell in FIG. 6A, in accordance with one embodiment.

Referring momentarily to FIGS. 6B-6C, representational views of the p-MTJ sensor stack 602 having two different magnetic orientation schemes are illustrated. Looking first to FIG. 6B, the magnetic orientations of the reference layer 610 and the free layer 606 are oriented according to a scheme which causes the p-MTJ sensor stack 602 to have a higher resistance (at least in comparison to the resistance resulting from the magnetic orientation scheme in FIG. 6C), which may signify a logical "1". Looking now to FIG. 6C, the magnetic orientations of the reference layer 610 and the free layer 606 are oriented according to a scheme which causes the p-MTJ sensor stack 602 to have a lower resistance (at least in comparison to the resistance resulting from the magnetic orientation scheme in FIG. 6B), which may signify a logical "0".

However, it should be noted that magnetic orientations depicted in FIGS. 6B-6C are in no way intended to be limiting and may differ depending on the approach. For instance, the magnetic orientation scheme illustrated in FIG. 6B may be interpreted as representing a logical "0", while the magnetic orientation scheme illustrated in FIG. 6C may be interpreted as representing a logical "1".

Memory which implements MRAM cells, e.g., as shown in FIGS. 5A-6C, is desirable in view of the fast data access times, ability to handle high intensity write loads, non-volatile storage nature, etc. Accordingly, MRAM based memory may even be used to form high performance (e.g., high throughput) write caches. However, while MRAM based memory may be able to satisfy high throughput write streams, the act of physically performing a write operation does consume a notable amount of system resources.

In fact, the amount of energy involved with performing a write operation on an MRAM-based SSD is notably higher than the amount of energy involved with performing a read operation on the same MRAM-based SSD. Accordingly, the number of write operations performed by a given storage system implementing MRAM-based SSDs may have a significant effect on the amount of energy consumed by the system. Moreover, the processes involved with writing certain types of data may also have an effect on the amount of energy consumed by the storage system, as well as the reliability (e.g., security) of the data stored therein. For instance, a significant difference may exist in the amount of energy consumed by writing a logical "1" compared with writing a logical "0" to a memory cell having a MTJ sensor stack.

Accordingly, the processes involved with actually writing a logical "1" to a MRAM cell consumes a notably higher amount of energy than the processes involved with writing a logical "0" to the same cell. The increased amount of energy involved with writing logical "1s" may also lead to resistance variation and disturb neighboring MRAM cells, thereby causing data retention to suffer. Attempts to counteract these effects have lead conventional products to apply higher currents for each transition, in-turn leading to an even greater increase in the power consumption of the memory array. As a result, conventional MRAM based products have suffered from degraded performance resulting from low data retention, increased bit error rates, decreased efficiency, etc.

In sharp contrast, the various embodiments included herein are able to improve performance of storage systems by prioritizing certain storage operations based on the current status of the memory. The current status of the memory may be determined based on a number of different factors and/or characteristics, e.g., as will be described in further detail below. Accordingly, some of the embodiments included herein are able to improve data retention, reduce bit error rates, increase operating efficiency, etc. It should also be noted that the difference between logical "1s" and logical "0s" are in no way intended to be limiting. Rather, the various approaches included herein may be described in terms of a first logical state and a second logical state, e.g., as would be appreciated by one skilled in the art after reading the present description.

Figure 7A:
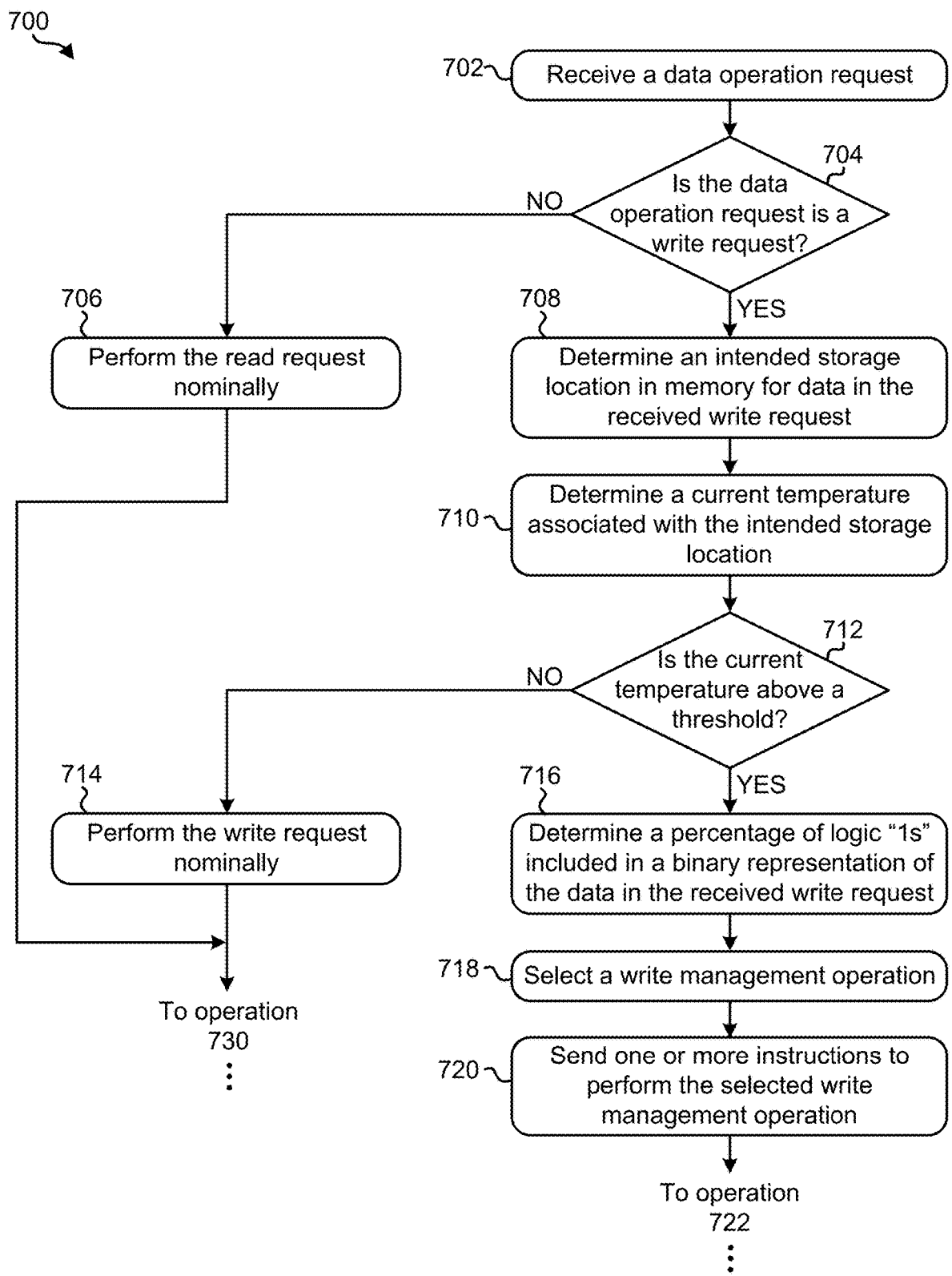
FIG. 7A is a flowchart of a method, in accordance with one embodiment.
Figure 7A:
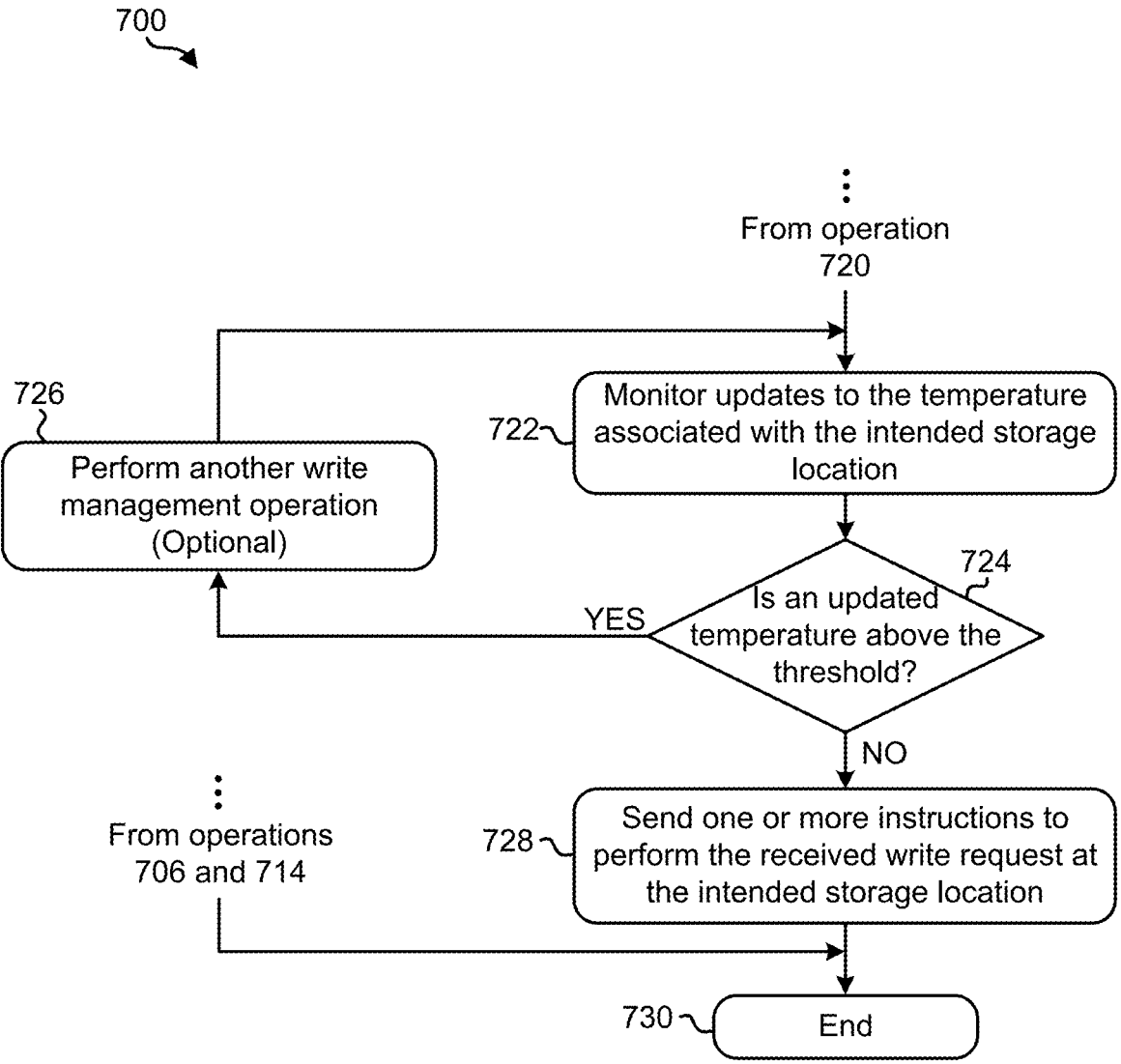

Referring now to FIG. 7A, a flowchart of a method 700 for identifying and/or monitoring the temperature of the various memory components included in a storage system is shown according to one embodiment. The method 700 may be performed in accordance with the present invention in any of the environments depicted in FIGS. 1A-5C, among others, in various embodiments. Of course, more or less operations than those specifically described in FIG. 7A may be included in method 700, as would be understood by one of skill in the art upon reading the present descriptions.

Each of the steps of the method 700 may be performed by any suitable component of the operating environment. For example, in various embodiments, the method 700 may be partially or entirely performed by a controller, a processor, a computer, etc., or some other device having one or more processors therein. Thus, in some embodiments, method 700 may be a computer-implemented method. In such embodiments, the computer used to implement the method may include a hot write controller. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 700. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 7A, operation 702 of method 700 includes receiving a data operation request. Depending on the approach, the data operation request may be received from a host (e.g., user), a different storage system, a processor as a result of performing a reoccurring data management process, etc. Moreover, once the data operation request has been received, method 700 proceeds to decision 704 which determines whether the received data operation request is a write request. In other words, decision 704 determines whether the received data operation request is a read request or a write request.

According to some approaches, the received data operation request may be "snooped" (e.g., examined) in order to determine whether it is actually a read request or a write request. Snooping the data operation request may involve examining metadata corresponding to the data operation request, determining whether the data operation request actually includes data to be written to memory, user inputs, etc. Moreover, snooping the data operation request may also reveal information pertaining to an intended storage location for data operation requests which are a write request. The intended storage location may be further examined before the write request is performed, e.g., as will be described in further detail below.

Method 700 proceeds to operation 706 in response to determining that the received data operation request is not a write request. There, operation 706 includes performing the read request "nominally". As mentioned above, read requests consume a significantly lower amount of system resources to perform in comparison to write requests. Accordingly, read requests may be performed "nominally" (e.g., without implementing any preliminary efficiency based write management operations) without negatively impacting performance of the storage system and/or processor implementing method 700.

From operation 706, the flowchart of FIG. 7A proceeds to operation 730, whereby method 700 may end. However, it should be noted that although method 700 may end upon reaching operation 730, any one or more of the processes included in method 700 may be repeated in order to receive and process additional data operation requests. In other words, any one or more of the processes included in method 700 may be repeated for continued data management of the storage system.

Returning to decision 704, method 700 proceeds to operation 708 in response to determining that the received data operation request is a write request. In other words, method 700 proceeds to operation 708 in response to determining a write request has been received. There, operation 708 includes determining an intended storage location in memory for data in the received write request. As alluded to above, due to the intrinsic properties of MRAM, MRAM-based SSDs write data out-of-place whereby a mapping table (e.g., LPT) maps logical addresses of the written data to physical addresses. Accordingly, the physical location where data corresponding to a received write request will be stored is preferably determined before the data is actually written to memory. This physical location may be determined using any processes which would be apparent to one skilled in the art after reading the present description.

The memory may also have different physical configurations depending on the approach. For instance, referring momentarily to FIG. 8A, a partial schematic view of a storage system 800 having a MRAM based SSD 801 is illustrated in accordance with one embodiment. As an option, the present system 800 may be implemented in conjunction with features from any other embodiment listed herein, such as those described with reference to the other FIGS., such as FIGS. 1-5A. However, such system 800 and others presented herein may be used in various applications and/or in permutations which may or may not be specifically described in the illustrative embodiments listed herein. Further, the system 800 presented herein may be used in any desired environment. Thus FIG. 8A (and the other FIGS.) may be deemed to include any possible permutation.

As shown, the SSD 801 includes a plurality of DIMMs 802 and a controller 803. Although not shown, the DIMMs 802 may be coupled to a serial interface (e.g., such as an I2C serial computer bus), or other similar interfaces in order to receive data, requests, commands, etc. The controller 803 may be used to manage various data-based processes performed on the DIMMs 802. According to some approaches, controller 803 may be configured to perform any one or more of the processes included in method 700. Thus, the controller 803 may serve as a hot write controller which is able to prioritize certain data management operations, e.g., as would be appreciated by one skilled in the art after reading the present description. Moreover, controller 803 may include additional sub-components and/or logic included therein. For instance, in some approaches the SSD 801 may be implemented in conjunction with an embedded and/or high performance computing (HPC) server node. Thus, controller 803 may be server-based controller.

Figure 8A:
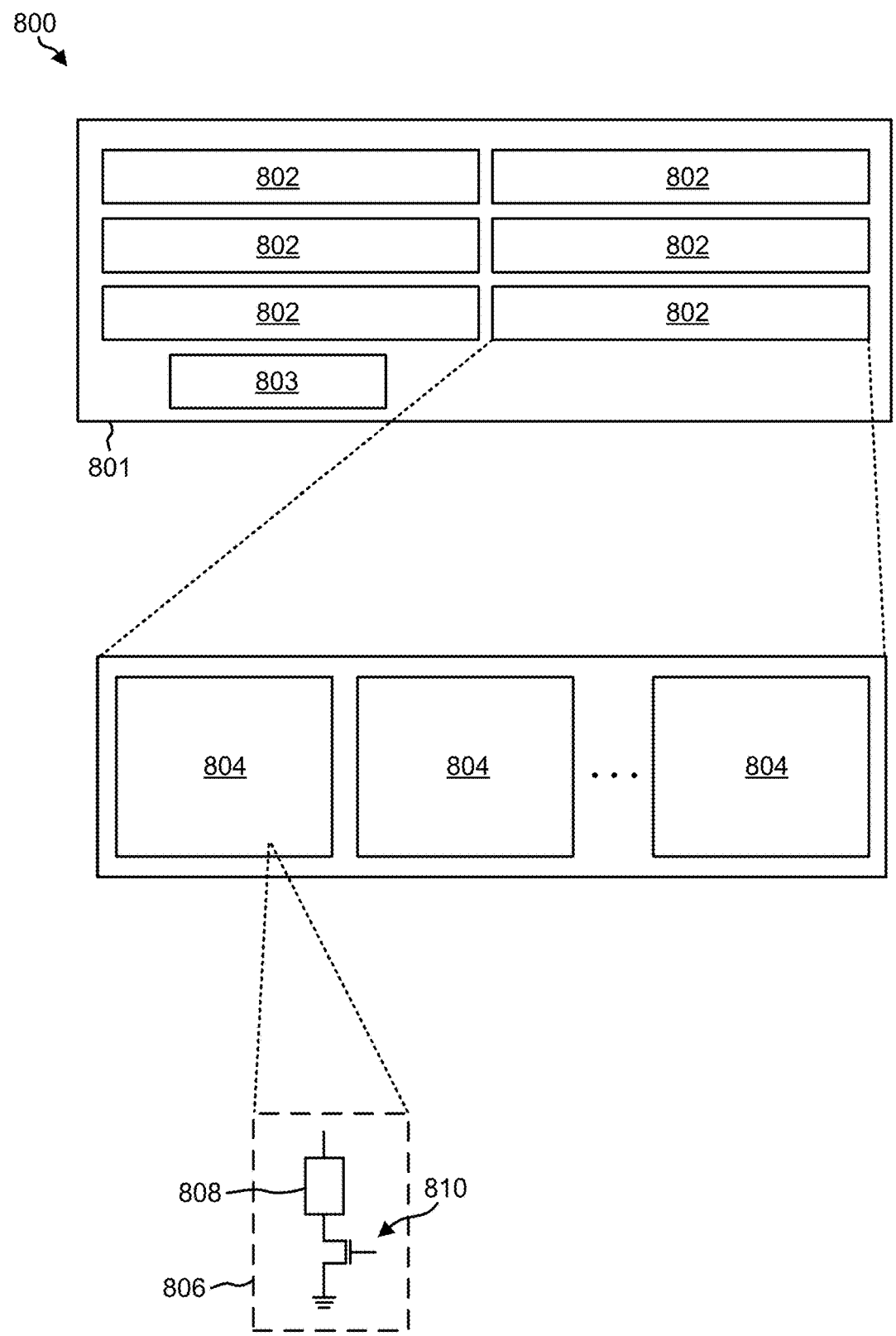
FIG. 8A is a partial representational view of a storage system, in accordance with one embodiment.

Referring still to FIG. 8A, each of the DIMMs 802 in the system 800 may include a plurality of MRAM circuits 804 (e.g., chips) included therein as shown in the exploded view of the DIMM 802. Furthermore, each of the MRAM circuits 804 includes a multitude of MRAM cells 806. As described above, each of the MRAM cells 806 includes a MTJ sensor stack 808 and a transistor 810, which together may be used to selectively store a bit of information in the form of a logical "1" or a logical "0".

Figure 8B:
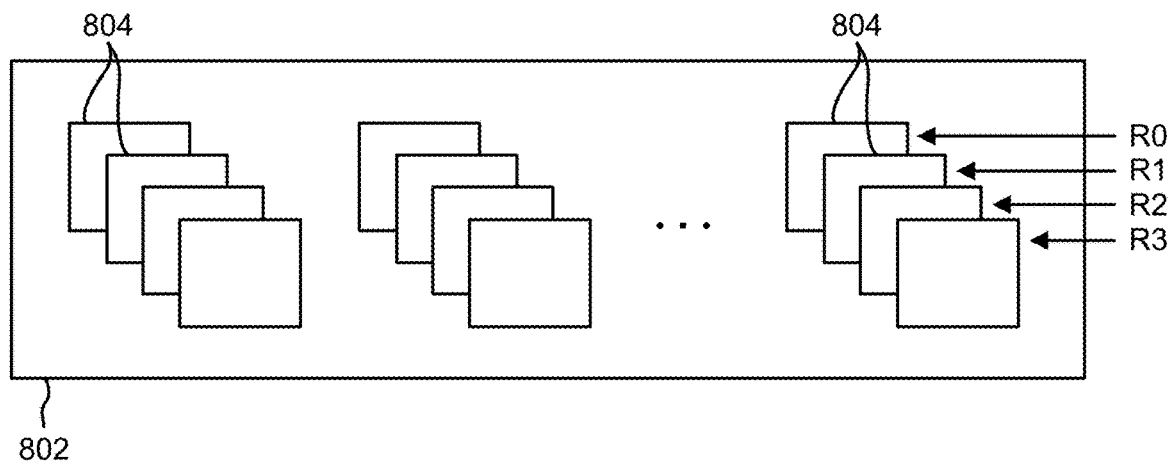
FIG. 8B is a partial representational view of the architecture of the dual in-line memory modules (DIMMs) in FIG. 8A, in accordance with one embodiment.

As alluded to above, the plurality of MRAM circuits 804 included in each of the DIMMs 802 may be organized differently depending on the approach. For instance, referring momentarily to FIG. 8B, DIMM 802 includes MRAM circuits 804 which are organized in an illustrative two-dimensional configuration. The MRAM circuits 804 in each of the rows extending across the DIMM 802 may be referred to as a "rank". Accordingly, the four different rows of MRAM circuits 804 have been labeled as R0, R1, R2 and R3.

Figure 8C:
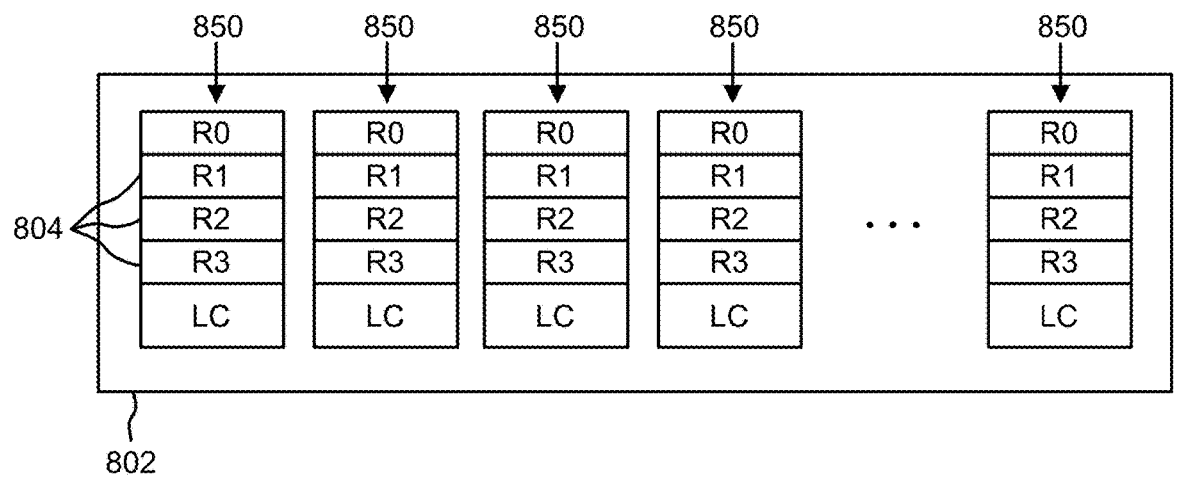
FIG. 8C is a partial representational view of the architecture of the dual in-line memory modules (DIMMs) in FIG. 8A, in accordance with one embodiment.

Now referring momentarily to FIG. 8C, DIMM 802 includes MRAM circuits 804 which are organized in an illustrative three-dimensional configuration. Here, subsets of the MRAM circuits 804 are grouped into stacks 850, each of which includes a logic chip LC. Again, the MRAM circuits 804 in each of the rows extending across the DIMM 802 may be referred to as a "rank", and have been labeled as R0, R1, R2 and R3 accordingly.

Regardless of the configuration of the DIMMs 802, it is preferred that the system 800 is able to identify and monitor the temperature of the various memory components included therein. This temperature based information may further be used to increase efficiency, improve reliability, decrease bit error rates, reduce energy consumption, etc., as will be described in further detail below.

Referring back to FIG. 7A, once the intended storage location in memory for data in the received write request has been determined, method 700 further includes determining a current temperature associated with the intended storage location. See operation 710. As described above, the data stored in memory may have a "write heat" associated therewith, which refers to the rate (e.g., frequency) at which the data is accessed, e.g., rewritten with new data. Moreover, each of the physical locations in memory may have a thermal "temperature" associated therewith, which may correspond to the amount of throughput the physical locations have experienced recently. However, it should be noted that while "write heat" associated with particular data, and thermal "temperature" associated with physical locations in memory may appear to represent a measurement of the same condition, "write heat" is intended to represent a measurement of a theoretical (e.g., abstract) temperature associated with the data, while the thermal "temperature" is intended to represent a measurement of the degree or intensity of heat present in and/or surrounding a physical storage location in memory.

As would be appreciated by one skilled in the art, heat is a thermal byproduct of physical (imperfect) systems performing work. As work is performed by physical components, heat is produced as a result of the inability to achieve perfect conservation of energy. Accordingly, heat is produced by the physical components in memory as data is stored (e.g., written) thereon. For example, referring momentarily back to FIG. 5A, as an electrical current is passed through the transistor 504, the sensor stack 502, or even the electrical connections extending therebetween, the intrinsic resistance of these components causes some energy to be released from the components as heat. Moreover, the amount of heat released by a single MRAM cell 500 is correlated to the throughput experienced by that MRAM cell 500. As the number of writes performed by the MRAM cell 500 increases over a given period, the amount of thermal heat produced by the cell increases as well. However, as the number of writes performed by the MRAM cell 500 decreases over the period, so does the amount of thermal heat produced by the cell.

Referring again to FIG. 7A, operation 710 may be determined in a number of different ways, e.g., depending on the approach. For instance, in some approaches, a value representing the current temperature associated with each physical storage location in a storage system may be maintained over time (e.g., by a thermal processor) and stored in memory. Thus, in some approaches operation 710 may be performed by simply accessing a lookup table in memory which maintains a current temperature associated with each physical storage location in memory. However, in other approaches the current temperature associated with the intended storage location may be determined in real-time by sampling a thermal profile of the intended storage location using a thermal sensor, e.g., such as a distributed temperature sensing (DTS) component or any other type of thermal sensor which would be apparent to one skilled in the art after reading the present description. Accordingly, a thermal sensor may be positioned near, coupled to, positioned adjacent to, etc. each of the physical storage locations in memory such that an accurate and updated temperature reading may be determined upon request. Furthermore, in other approaches the current temperature associated with the intended storage location may be determined by examining a list of operations performed at the intended storage location and calculating the current temperature accordingly. For instance, a thermal profile of the memory cells located at the intended storage location may be developed over time, during manufacture, etc., and used to determine a current temperature. Moreover, in still other approaches, the current temperature associated with the intended storage location may be determined using any desired processes which would be apparent to one skilled in the art after reading the present description.

The process involved with determining a current temperature associated with the intended storage location may also depend on the physical configuration of the memory itself. Referring momentarily again to FIGS. 8A-8C, the physical components included in memory may be arranged to have a two-dimensional configuration or a three-dimensional configuration in some approaches. For approaches in which the memory has a three-dimensional configuration and/or is used as chips, DTS sensors (or any desired type of temperature sensor) may be coupled to, positioned near, located adjacent to, etc. each die of memory in order to accurately read the temperature of each of the memory arrays or chips. Temperature information corresponding to each stack of memory having a three-dimensional configuration may also be stored in each of the logic chips (e.g., see LC in FIG. 8C) in some approaches. In other approaches temperature information may be stored in a memory controller and/or a media controller depending on the application. The memory controller may thereby read the temperature information corresponding to each of the die and/or ranks of physical memory, in order to identify the hot ranks vs hot chips in memory. However, it should be noted that any process of determining the current temperature at a specific location in memory which would be apparent to one skilled in the art after reading the present description may be implemented.

Method 700 further includes determining whether the current temperature associated with the intended storage location is above a threshold. See decision 712. In other words, decision 712 includes determining whether a value of the current temperature determined in operation 710 is undesirably high. However, it should be noted that "above a threshold" is in no way intended to limit the invention. Rather than determining whether a value is above a threshold, equivalent determinations may be made, e.g., as to whether a value is inside a predetermined range, whether a value is outside a predetermined range, whether an absolute value is above a threshold, whether a value is below a threshold, etc., depending on the desired approach.

As described in detail above, heat is a thermal byproduct of physical (imperfect) systems. It follows that heat is produced by physical components in memory as data is stored (e.g., written) thereon. However, as the temperature of the physical components in memory increases above desirable levels, the physical components may become damaged, write and/or read operations may fail thereby increasing the bit error rate, data stored in memory may be corrupted and/or lost altogether, etc. Thus, by determining whether the current temperature associated with the intended storage location is above a threshold, preemptive measures may be taken in order to maintain the integrity of the storage system as well as the data stored thereon.

As shown, method 700 may proceed to operation 714 in response to determining that the current temperature associated with the intended storage location is not above a threshold. In other words, method 700 may proceed to operation 714 in response to determining that the intended storage location is sufficiently cold (not hot) to perform additional write requests without threatening integrity of the memory components at the intended storage location, data security, the bit error rate, etc. Accordingly, operation 714 includes performing the write request "nominally" (e.g., without implementing any preliminary efficiency based write management operations) without negatively impacting performance of the storage system and/or processor implementing method 700. However, it should be noted that performing the write request at the intended storage location may cause the temperature associated therewith to increase. Accordingly, the effects that performing the write request at the intended storage location will have may also be taken into consideration when performing decision 712.

From operation 714, the flowchart of FIG. 7A proceeds to operation 730, whereby method 700 may end. As noted above, although method 700 may end upon reaching operation 730, any one or more of the processes included in method 700 may be repeated in order to receive and process additional data operation requests. In other words, any one or more of the processes included in method 700 may be repeated for continued data management of the storage system.

Returning to decision 712, method 700 proceeds to operation 716 in response to determining that the current temperature associated with the intended storage location is above a threshold. In other words, method 700 may proceed to operation 716 in response to determining that the intended storage location is sufficiently hot (not cold) that additional write requests should not be performed, as they may threaten the integrity of the memory components at the intended storage location, data security, a bit error rate, etc. Rather, one or more write management operations may be performed prior to the received write request in order to allow and/or cause the current temperature associated with the intended storage location to decrease, e.g., as will soon become apparent.

In preferred approaches, the one or more write management operations performed may depend on the actual data included in the write request itself. In other words, the actual data included in the write request itself is preferably used to determine the one or more write management operations which are actually performed. Again, the processes involved with actually writing a logical "1" to a MRAM cell consumes a notably higher amount of energy than the processes involved with writing a logical "0" to the same cell. Accordingly, operation 716 includes determining a percentage of logical "1s" included in a binary representation of the data in the received write request. However, as described above, the difference between logical "1s" and logical "0s" are in no way intended to be limiting. Rather, the various approaches included herein may be described in terms of a first logical state and a second logical state. For instance, operation 716 may include determining a percentage of first logical states (compared to a percentage of second logical states) included in a binary representation of the data in the received write request, e.g., as would be appreciated by one skilled in the art after reading the present description.

In some approaches, the received write request may be divided into bursts, each of which include a same number of bits. For example, the received write request may include a plurality of 64 bit bursts. Thus, operation 716 may be performed by examining each of the bursts and counting a total number of logical "1s" included therein. Moreover, the total number of logical "1s" counted may be compared against the total number of bits to calculate a relative percentage. It is also preferred that the number of logical "1s" included in the binary representation of the data in the received write request is only determined (e.g., counted) once. By only determining the percentage of logical "1s" included therein once for each of the received write requests, the amount of computing resources exerted may desirably be reduced. Thus, the amount of computing overhead added to the system is minimal compared to the improved reliability that is achieved as a result. Once the percentage of logical "1s" included in the binary representation of the data in the received write request have been determined, the percentage and any corresponding information may be stored in memory, e.g., for later use.

It should be noted that other factors may also be considered when selecting the one or more write management operations which are performed. For instance, a priority level of the write request, the type of data, the type of memory being used, etc. In other approaches, the current temperature associated with the intended storage location and how it compares to the threshold may be considered when selecting the one or more write management operations which are performed. For instance, more thermally intensive (e.g., aggressive) write management operations may be performed in situations where the current temperature associated with the intended storage location is significantly higher than the threshold. However, less thermally intensive (e.g., aggressive) write management operations may be performed in situations where the current temperature associated with the intended storage location is closer to the threshold. Thus, some approaches may even implement one or more additional thresholds which may be used to actually select the one or more write management operations to perform.

Referring still to method 700, it should be noted that determining the current temperature associated with the intended storage location as seen in operation 710, and determining the percentage of logical 1s included in the binary representation of the data in the received write request as seen in operation 716 are preferably performed simultaneously and/or in parallel. As a result, the storage system implementing the various processes included in method 700 may be able to more efficiently (e.g., quickly) determine the status of the intended storage location as well as the type of data included in the received write request. This simultaneous and/or parallel performance of operations 710 and 716 may desirably reduce processing delays, increase system throughput, further improve data retention, etc., as will be described in further detail below.

Referring still to FIG. 7A, method 700 further includes selecting a write management operation. See operation 718. As mentioned above, one or more write management operations may be performed in response to determining that the intended storage location is sufficiently hot that additional write requests should not be performed, as they may threaten the integrity of the memory components at the intended storage location, data security, a bit error rate, etc. It follows that the one or more write management operations may be implemented prior to performing the received write request in order to allow and/or cause the current temperature associated with the intended storage location to decrease.

The actual write management operation implemented may be selected based on the determined percentage of logical 1s included in the binary representation. In other words, operation 718 may include selecting the write management operation based at least in part on the percentage of logical 1s determined as being included in the binary representation of the data. The greater the number of logical 1s included in the binary representation of the data, the larger the amount of energy will be consumed while performing the received write operation, which in turn may translate to a greater amount of heat being dissipated at the intended storage location. Thus, write management operations which are more effective in decreasing the temperature at a particular location in memory may desirably be implemented in situations having a higher percentage of logical 1s included in the binary representation of the data. On the other hand, write management operations which are less effective in decreasing the temperature at a particular location in memory (e.g., at least in comparison to the "more effective" write management operations) may be implemented in situations having a lower percentage of logical 1s included in the binary representation of the data. However, it should also be noted that in some approaches, the write management operation may be selected based on the current temperature associated with the intended storage location as well.

An exemplary list of write management operations includes, but is in no way limited to, delaying performance of the received write request, prioritizing read requests over the received write request, lowering a high water mark of a write queue, and discarding the received write request. Each of these write management operations may be enacted to effectively delay performance of the received write command until memory conditions, more specifically the thermal conditions at the intended storage location for the data in the received write request, become more conducive to write operations. For instance, delaying performance of the received write request allows for other read and/or write operations to be performed while the temperature at the intended storage location for the received write request is given time to decrease. Similarly, prioritizing read requests over the received write request allows the memory to continue processing requests that are received without causing a decrease to the throughput that the system is able to maintain. Moreover, lowering a high water mark of a write queue (e.g., at least partially clearing the write queue to make room for the received write request) allows for write operations to be enqueued for a longer amount of time without causing the write queue to become full and/or overflow while allowing the temperature at the intended storage location for the received write request to decrease. Furthermore, discarding (e.g., avoiding, gapping, etc.) the received write request may be enacted in certain situations where the write request includes a significant number of logical "1s" and/or the temperature at the intended storage location is significantly high. While discarding the received write request may desirably maintain data integrity at and/or near the intended storage location, preserve health of the memory components, create additional room in the write queue, etc., it also results in a failure of the received request. Accordingly, the benefits afforded by discarding the received write request may be weighed against the source of the request, the type of data included in the request, a priority level of the request, whether any other received write requests have also been disregarded, etc. However, various other write management operations which would be apparent to one skilled in the art after reading the present description may be implemented in other approaches.

As mentioned above, different write management operations may be more or less effective in reducing the current temperature associated with the intended storage location. The different write management operations may also have a different effect on the continued performance of the storage system as a whole. Accordingly, the write management operations may be prioritized depending on the situation. For instance, the write management operation implemented may depend on a percentage of logical "1s" included in the binary representation of data in the write request. In an illustrative approach, which is in no way intended to limit the invention, the write management operation selected in operation 718 may include: lowering a high water mark of a write queue in response to determining that the binary representation of the data includes less than or equal to x % logical 1s, delaying performance of the received write request in response to determining that the binary representation of the data includes less than or equal to y % logical 1s, prioritizing read requests over the received write request in response to determining that the binary representation of the data includes greater than y % logical 1s, and discarding the received write request in response to determining that the binary representation of the data includes greater than or equal to z % logical 1s. Moreover, the relationship between the foregoing percentages may be as follows: $x\% < y\% < z\%$. Accordingly, the write management operation selected in operation 718 may include lowering a high water mark of a write queue in response to determining that the binary representation of the data includes a lowest percentage of logical 1s, delaying performance of the received write request in response to determining that the binary representation of the data includes a lower than average percentage of logical 1s, prioritizing read requests over the received write request in response to determining that the binary representation of the data includes a higher than average percentage of logical 1s, and discarding the received write request in response to determining that the binary representation of the data includes a greatest percentage of logical 1s.

Illustrative values for the different percentages described above may be as follows: x=25, y=50, and z=85. In other illustrative approaches, "x" may be set equal to 25, "y" may be set equal to 75, and "z" may be set equal to 85, but any of these percentages may be higher or lower. Furthermore, it should be noted that the number and/or order of the write management operations listed above are in no way intended to be limiting. In other approaches more or fewer write management operations may be implemented and/or the order may be different, e.g., depending on storage system configurations, user preferences, type of data included in the received write request, the temperature at the intended storage location, etc.

From operation 718, the flowchart is illustrated as proceeding to operation 720 which includes sending one or more instructions to perform the write management operation selected in operation 718. Depending on where various ones of the processes included in method 700 are performed, the one or more instructions sent in operation 720 may be directed to different locations in the storage system. For instance, in some approaches method 700 may be performed by a hot write controller which is electrically coupled to the memory. Thus, operation 720 may include sending the one or more instructions directly to the intended storage location and/or voltage regulators coupled thereto. In other approaches, method 700 may be performed by a central storage controller and therefore operation 720 may include sending the one or more instructions to a memory controller to implement, e.g., as would be appreciated by one skilled in the art after reading the present description.

After operation 720 has been performed, and the selected write management operation has been implemented, method 700 also includes monitoring updates to the temperature associated with the intended storage location. See operation 722. The selected write management operation is implemented in an effort to reduce the current temperature associated with the intended storage location. Thus, after the write management operation has been implemented, the effectiveness of the operation may be determined by continuing to monitor the temperature associated with the intended storage location. The temperature associated with the intended storage location may be monitored by continuing to sample temperature readings received therefrom, issuing requests to the one or more temperature sensors which correspond to the intended storage location, waiting for an alert to be received, etc.

Decision 724 further includes determining whether an updated temperature associated with the intended storage location is still above the threshold (e.g., is still hot). In other words, decision 724 includes using information obtained during the continued monitoring to determine whether an updated value of the temperature at the intended storage location is still too hot to write to. Accordingly, performing decision 724 may include any of the same or similar approaches described above in relation to performing decision 712 above.

As shown, method 700 proceeds to optional operation 726 in response to determining that an updated temperature associated with the intended storage location is still above the threshold. There, operation 726 includes performing another (e.g., a different) write management operation. Operation 726 is "optional" because in some approaches, it may be more desirable to allow more time to pass by before changing the particular write management operation being implemented. For instance, some write management operations may take longer to have a significant effect on the temperature at a given storage location. Moreover, for the instances in which optional operation 726 is performed, the different write management operation may be performed in addition to, or in place of, the write management operation selected in operation 718.

From optional operation 726, method 700 returns to operation 722, whereby updates to the temperature associated with the intended storage location may continue to be monitored. Decision 724 may also be repeated in order to determine whether the added time and/or write management operation was able to drop the updated temperature associated with the intended storage location below the threshold. Accordingly, processes 722, 724, and 726 may be repeated in an iterative fashion until it is determined that the temperature at the intended storage location has fallen below the threshold.

Progressing to operation 728, one or more instructions are sent to perform the received write request at the intended storage location. As mentioned above, once the temperature at the intended storage location has fallen to a desirably level, the write request may be performed without jeopardizing the physical memory, the data included in the write request, retention of other data stored in the memory, etc. As a result, the reliability of the system is significantly increased without decreasing performance and/or efficiency. Furthermore, these improvements are also achieved without relocating the received write request to different (e.g., colder) storage locations in the memory if the temperature at the intended storage location is and/or remains undesirably high. Rather, one or more of the write management operations may be performed in response to determining that the current temperature associated with the intended storage location is and/or remains above a threshold.

Method 700 is also depicted as progressing to operation 730, whereby method 700 may end. However, it should be noted that although method 700 may end upon reaching operation 730, any one or more of the processes included in method 700 may be repeated in order to receive and process additional data operation requests. In other words, any one or more of the processes included in method 700 may be repeated for continued data management of the storage system.

Figure 7B:
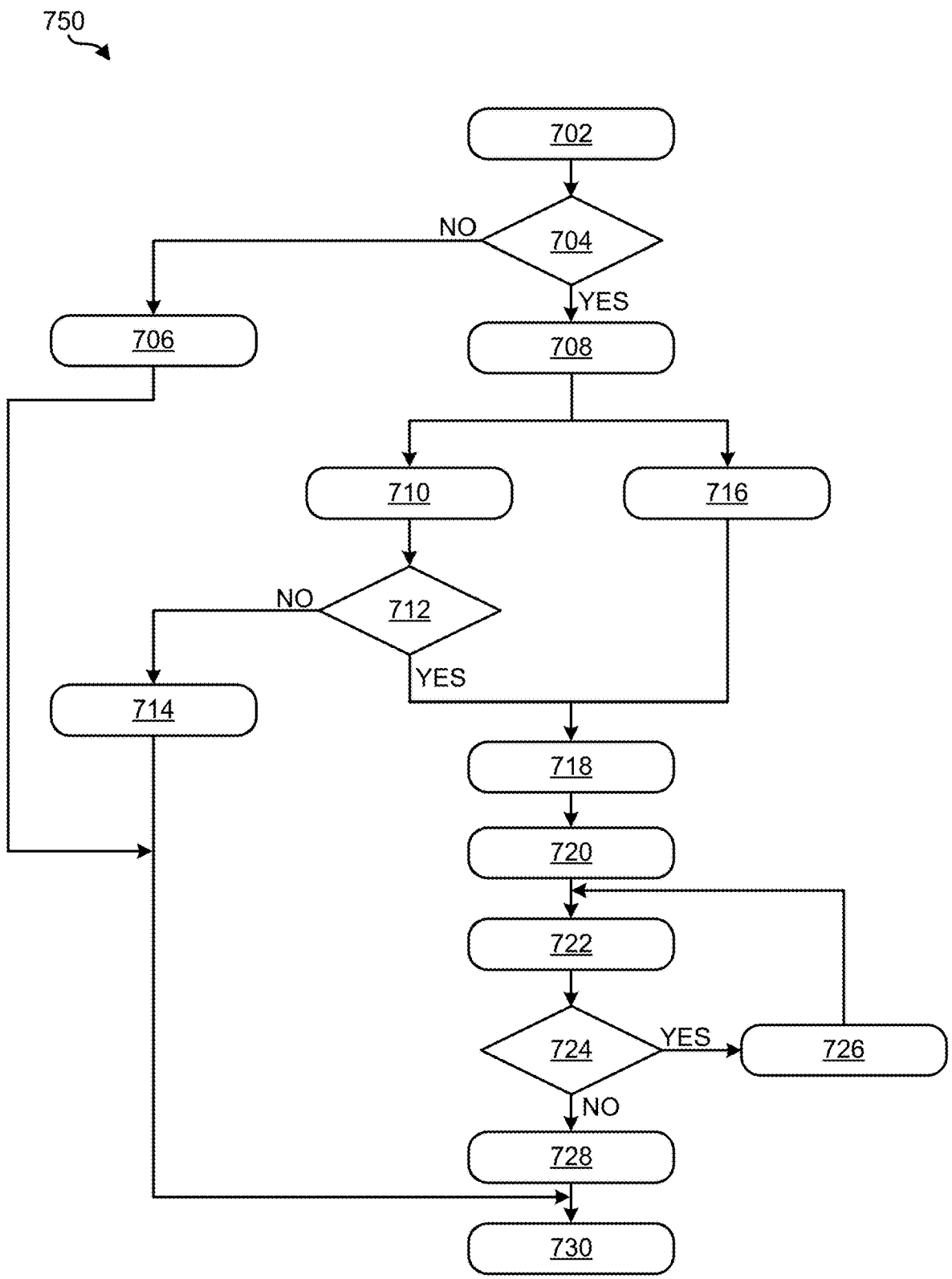
FIG. 7B is a flowchart of a method, in accordance with one embodiment.

As mentioned above, determining the current temperature associated with the intended storage location as seen in operation 710, and determining the percentage of logical 1s included in the binary representation of the data in the received write request as seen in operation 716 are preferably performed simultaneously and/or in parallel. Thus, although method 700 is depicted in FIG. 7A as progressing in a unidirectional fashion, at least some of the processes included therein may be performed simultaneously and/or in parallel by one or more processors which are configured to do so. Looking momentarily to method 750 of FIG. 7B, an exemplary variation of the processes included in method 700 of FIG. 7A is depicted. As shown, the various processes included in FIG. 7B have common numbering with those of FIG. 7A. Thus, although the text has been removed from the numbered processes included in FIG. 7B, each of the respective processes may include the same operations and decisions as those illustrated in FIG. 7A.

As shown, method 750 progresses from operation 702 through operation 708 similarly as described above for method 700. However, following operation 708, method 750 proceeds to perform processes 710, 712 in parallel with operation 716. Thus, multiple processes may be performed simultaneously by the same processor (e.g., configured to have at least two different processing channels) and/or different processors depending on the approach. As a result, the storage system implementing the various processes included in method 750 may be able to more efficiently (e.g., quickly) determine the status of the intended storage location as well as the type of data included in the received write request. This simultaneous and/or parallel performance of at least processes 710, 712, and 716 may desirably reduce processing delays, increase system throughput, further improve data retention, etc. Moreover, additional processes included in FIGS. 7A-7B may be performed in parallel, e.g., as would be appreciated by one skilled in the art after reading the present description.

Figure 9:
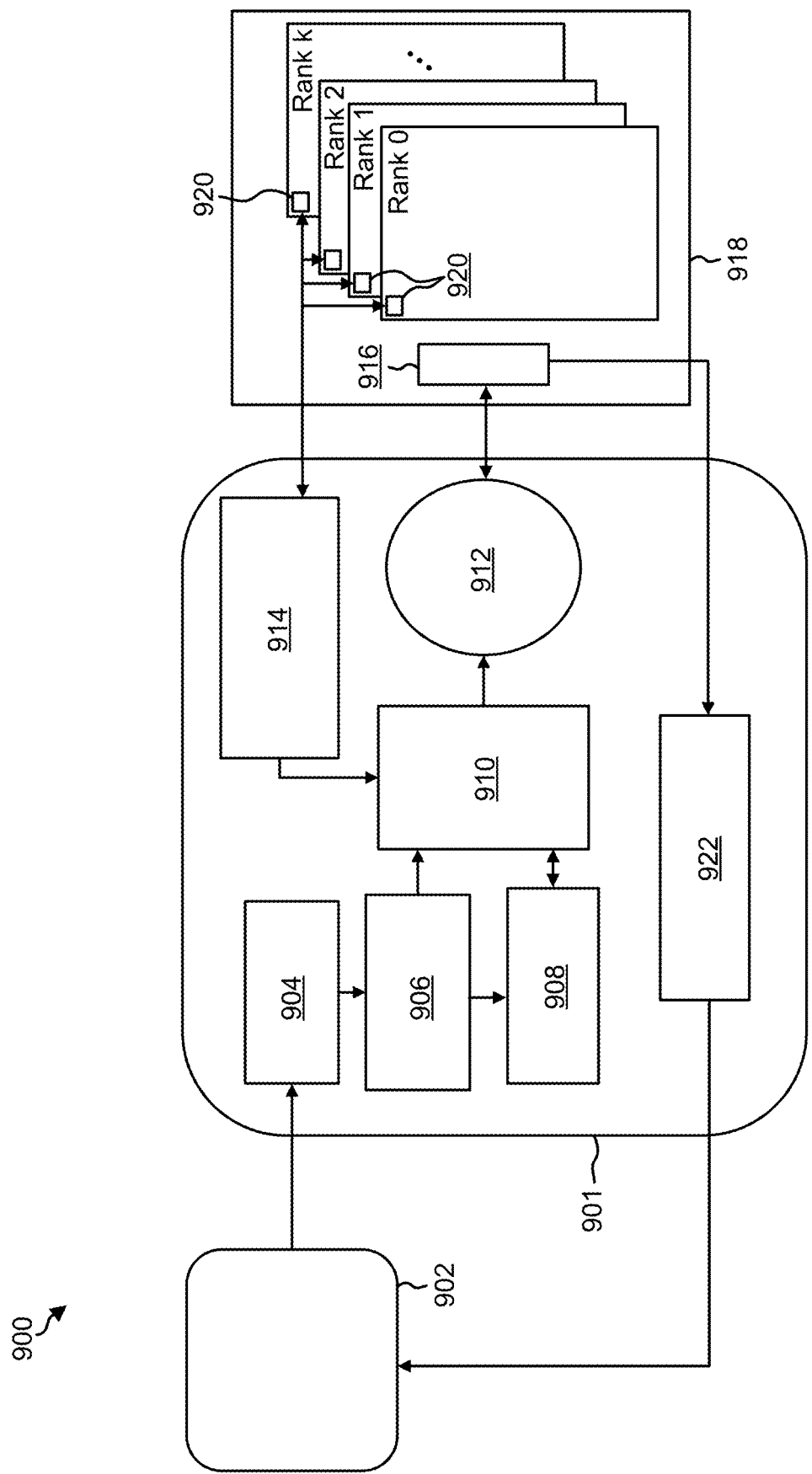
FIG. 9 is a partial representational view of a storage system, in accordance with one embodiment.

Referring now to FIG. 9, a storage system 900 is depicted in accordance with one embodiment. As an option, the present storage system 900 may be implemented in conjunction with features from any other embodiment listed herein, such as those described with reference to the other FIGS., such as FIGS. 7A-8C. However, such storage system 900 and others presented herein may be used in various applications and/or in permutations which may or may not be specifically described in the illustrative embodiments listed herein. Further, the storage system 900 presented herein may be used in any desired environment. Thus FIG. 9 (and the other FIGS.) may be deemed to include any possible permutation.

As shown, the storage system 900 includes a host 902 which is coupled to a transaction queue 904 in a processor 901. The processor 901 further includes an address map 906, which may also function as a smart decoder in some approaches, and a command queue 908, both of which are coupled to a hot write controller 910. In turn, the hot write controller 910 is coupled to a scheduler 912 as well as a thermal regulator 914. The scheduler 912 is further coupled to a memory controller 916 positioned in memory 918. The memory controller 916 may be used to actually read data from and/or write data to the various memory cells in the memory ranks Rank 0, Rank 1, Rank 2, ..., Rank k, e.g., as would be appreciated by one skilled in the art after reading the present description. Temperature sensors 920 are also coupled to each of the ranks Rank 0, Rank 1, Rank 2, ..., Rank k, and may thereby be able to gather temperature information corresponding to each of the ranks respectively. Moreover, each of the temperature sensors 920 may send the temperature information gathered to the thermal regulator 914.

Commands are received from the host 902 and accumulated in the transaction queue 904 such that the commands may be monitored and transferred to command queue 908. Each of the commands may be snooped in order to determine whether they include read requests and/or write requests, e.g., as described above. Once a command has been identified as a write request, the address map address map 906 may be used to decode the physical address which the data included in the write requests is to be written to. From this information, the specific ranks and/or dies corresponding to the physical address may be obtained. These physical addresses may be used to obtain temperature information corresponding thereto from the thermal regulator 914. Moreover, the hot write controller 910 may use this information to perform one or more of the various processes included in FIGS. 7A-7B in order to determine whether the write request is intended to be written to a physical memory location which is hot or cold, e.g., relative to a predetermined range or equivalently a predetermined threshold.

In response to determining that the data in the received write request corresponds to an intended storage location which is currently hot (e.g., at least hotter than preferred), the hot write controller 910 may implement one or more write management operations before the write request is actually performed. For instance, the write request may be held in a write queue maintained by the scheduler 912 in some approaches. Accordingly, the scheduler 912 is coupled to the memory controller 916, such that read and/or write commands may be sent to the memory controller 916 to perform.

While write requests are satisfied when the data is written to memory, satisfying read requests typically involves sending information read from memory in response to the received read request. Thus, memory controller 916 is also coupled to a read queue 922 which may be used to accumulate data as it is read from memory, and eventually return to the host 902, e.g., once all the data corresponding to the read request has been accumulated.

It follows that various ones of the approaches included herein are able to selectively adjust write performance based on current system settings, thereby improving efficiency. Utilizing temperature information corresponding to the physical storage components in memory in combination with the logical content of write requests allows some of the approaches herein to increase the reliability of memory subsystems which implement memory technologies which have asymmetric write and read energies. This may be achieved by improving thermal profiles (e.g., making them more homogeneous) of both two and three-dimensional memory configurations, while having little-to-no impact on performance, thereby also conserving energy by handling writes effectively. By keeping the temperature of various memory components under control and controlling the current implemented to perform the write operations (particularly those write operations having a significant number of logical "1s"), various ones of the embodiments included herein are able to extend the expected lifetime and increase the reliability of memory subsystems.

As described above, it should be noted that although various approaches included herein rely on the assertion that writing a logical "1" consumes more energy than writing a logical "0", any of the approaches included herein may be adjusted and applied with types of memory which consume more energy writing a logical "0" than writing a logical "1", e.g., as would be appreciated by one skilled in the art after reading the present description. In other words, the differences between logical "1s" and logical "0s" are in no way intended to be limiting. Rather, the various approaches included herein may be described in terms of a first logical state and a second logical state. For instance, some of the approaches included herein determine a percentage of first logical states (compared to a percentage of second logical states) included in a binary representation of the data in the received write request, e.g., as would be appreciated by one skilled in the art after reading the present description.

Furthermore, it should also be noted that although various ones of the approaches included herein have been described in the context of block addressable devices, this is in no way intended to limit the invention. Accordingly, any of the approaches included herein may be implemented using byte addressable devices which provide byte level access to memory, e.g., as would be appreciated by one skilled in the art after reading the present description. In some approaches, additional hardware may be implemented which allows for byte-to-block and/or block-to-byte conversions in order to achieve a storage system which has block and byte level access. As a result, various approaches included herein may be used as a write cache for a given drive, thereby increasing the boot time when the given drive is used to boot the storage system, e.g., especially in SSD. Other approaches may be implemented to desirably transform MRAM into a DRAM-like device with persistency. Still other approaches may be able to achieve a SSD device which is compatible with a PCIe memory slot, and thereby may be compatible with a NVMe protocol.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Figure 10:
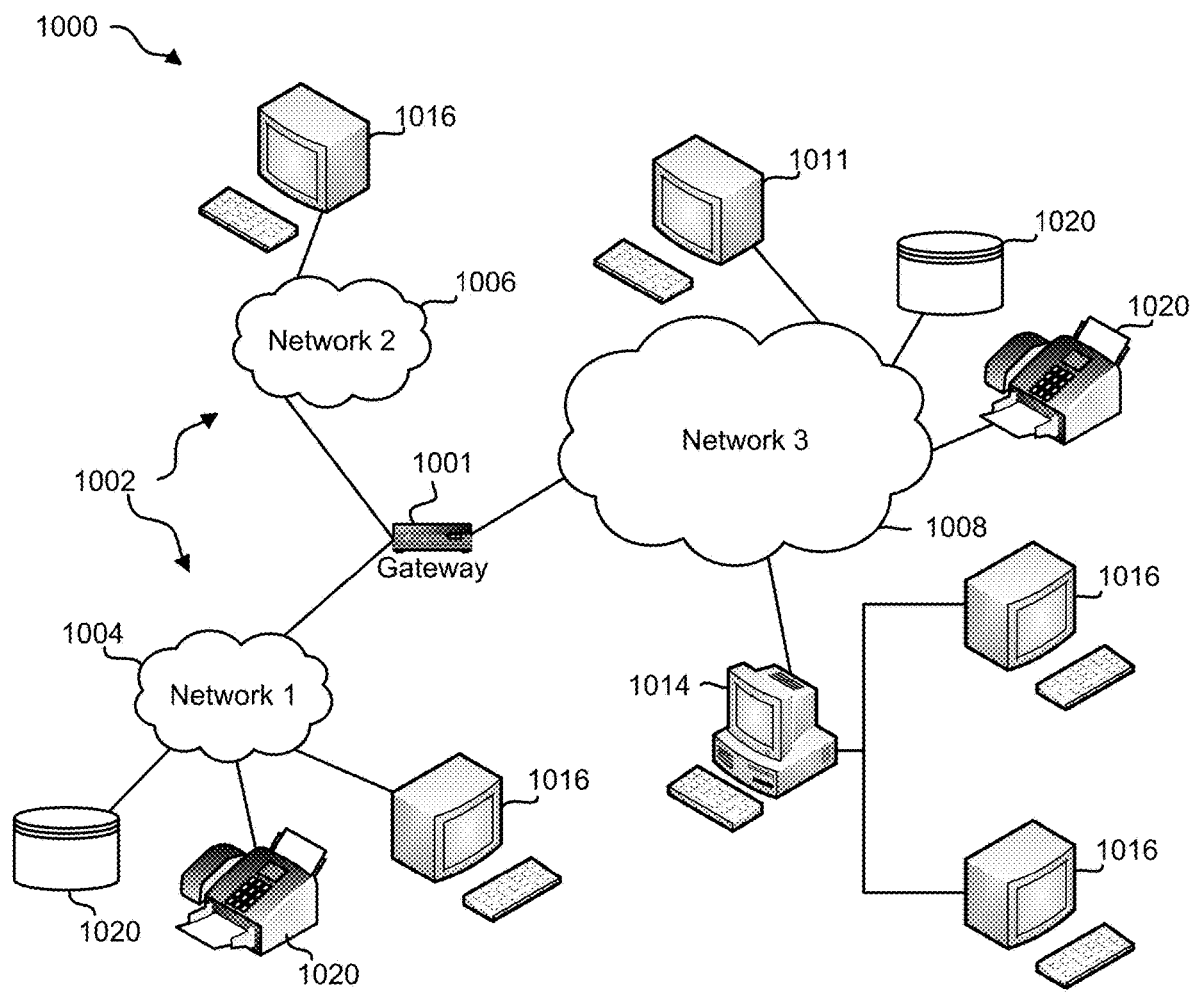
FIG. 10 is a network architecture, in accordance with one embodiment.

FIG. 10 illustrates a network architecture 1000, in accordance with one embodiment. As shown in FIG. 10, a plurality of remote networks 1002 are provided including a first remote network 1004 and a second remote network 1006. A gateway 1001 may be coupled between the remote networks 1002 and a proximate network 1008. In the context of the present network architecture 1000, the networks 1004, 1006 may each take any form including, but not limited to a LAN, a WAN such as the Internet, public switched telephone network (PSTN), internal telephone network, etc.

In use, the gateway 1001 serves as an entrance point from the remote networks 1002 to the proximate network 1008. As such, the gateway 1001 may function as a router, which is capable of directing a given packet of data that arrives at the gateway 1001, and a switch, which furnishes the actual path in and out of the gateway 1001 for a given packet.

Further included is at least one data server 1014 coupled to the proximate network 1008, and which is accessible from the remote networks 1002 via the gateway 1001. It should be noted that the data server(s) 1014 may include any type of computing device/groupware. Coupled to each data server 1014 is a plurality of user devices 1016. Such user devices 1016 may include a desktop computer, laptop computer, handheld computer, printer, and/or any other type of logic-containing device. It should be noted that a user device 1011 may also be directly coupled to any of the networks, in some embodiments.

A peripheral 1020 or series of peripherals 1020, e.g., facsimile machines, printers, scanners, hard disk drives, networked and/or local data storage units or systems, etc., may be coupled to one or more of the networks 1004, 1006, 1008. It should be noted that databases and/or additional components may be utilized with, or integrated into, any type of network element coupled to the networks 1004, 1006, 1008. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 1004, 1006, 1008, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 11:
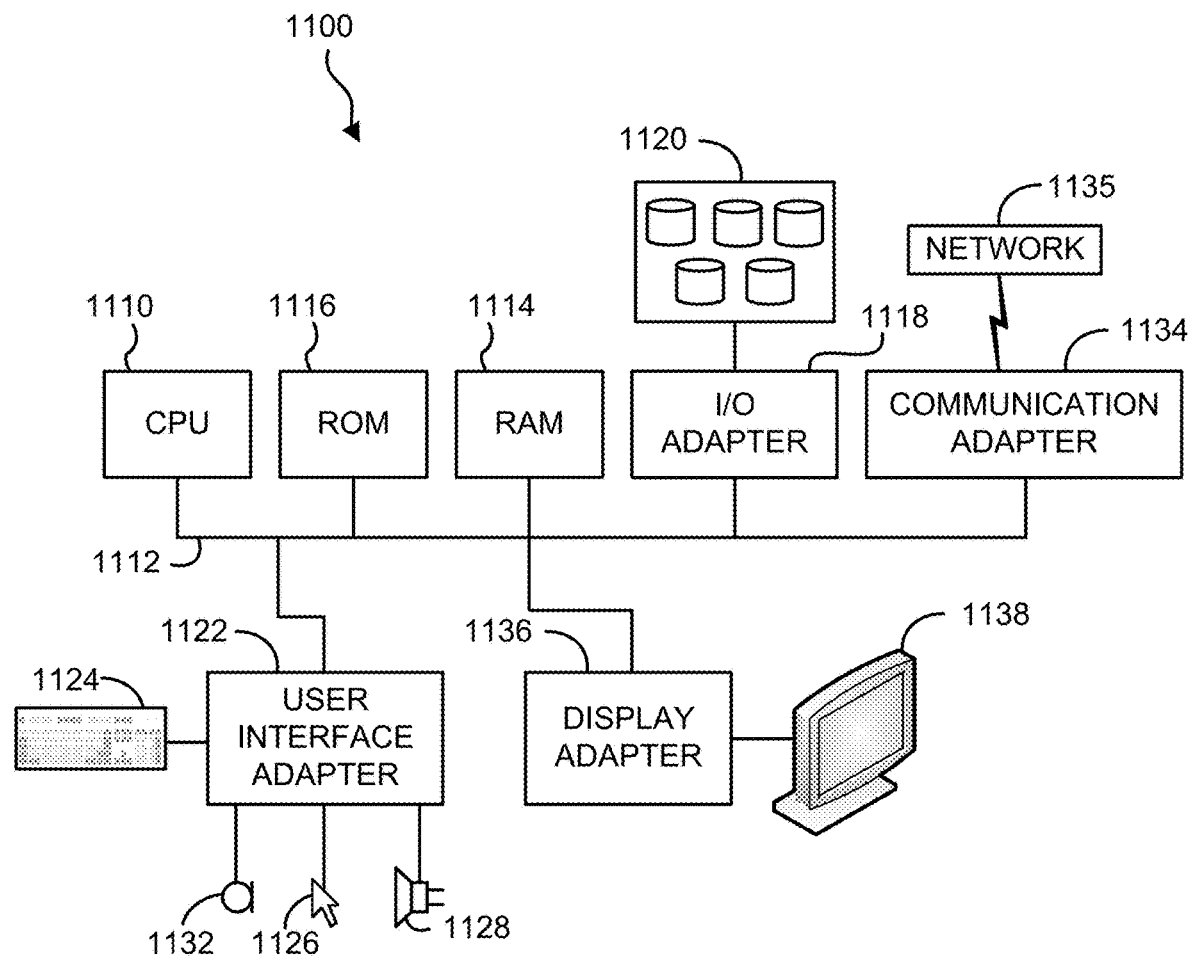
FIG. 11 is a representative hardware environment that may be associated with the servers and/or clients of FIG. 10, in accordance with one embodiment.

FIG. 11 shows a representative hardware environment associated with a user device 1016 and/or server 1014 of FIG. 10, in accordance with one embodiment. FIG. 11 illustrates a typical hardware configuration of a processor system 1100 having a central processing unit 1110, such as a microprocessor, and a number of other units interconnected via a system bus 1112, according to one embodiment. In some embodiments, central processing unit 1110 may include any of the approaches described above with reference to the one or more processors 210 of FIG. 2.

The processor system 1100 shown in FIG. 11 includes a Random Access Memory (RAM) 1114, Read Only Memory (ROM) 1116, and an I/O adapter 1118. According to some embodiments, which are in no way intended to limit the invention, I/O adapter 1118 may include any of the approaches described above with reference to I/O adapter 218 of FIG. 2. Referring still to processor system 1100 of FIG. 11, the aforementioned components 1114, 1116, 1118 may be used for connecting peripheral devices such as storage subsystem 1120 to the bus 1112. In some embodiments, storage subsystem 1120 may include a similar and/or the same configuration as data storage system 220 of FIG. 2. According to an example, which is in no way intended to limit the invention, storage subsystem 1120 may include non-volatile data storage cards, e.g., having NVRAM memory cards, RAM, ROM, and/or some other known type of non-volatile memory, in addition to RAID controllers as illustrated in FIG. 2.

With continued reference to FIG. 11, a user interface adapter 1122 for connecting a keyboard 1124, a mouse 1126, a speaker 1128, a microphone 1132, and/or other user interface devices such as a touch screen, a digital camera (not shown), etc., to the bus 1112.

Processor system 1100 further includes a communication adapter 1134 which connects the processor system 1100 to a communication network 1135 (e.g., a data processing network) and a display adapter 1136 which connects the bus 1112 to a display device 1138.

The processor system 1100 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 12:
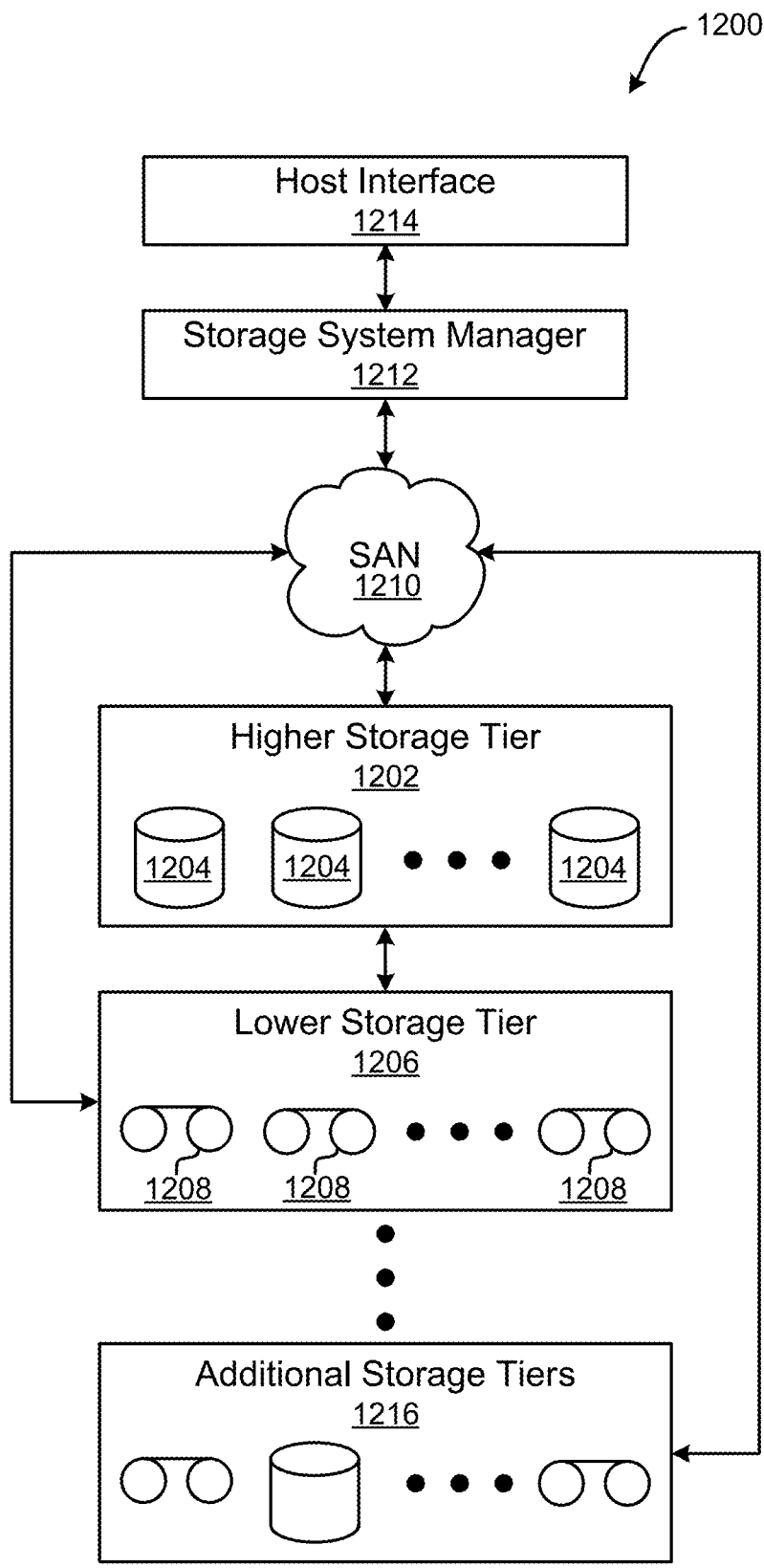
FIG. 12 is a tiered data storage system in accordance with one embodiment.

Moreover, FIG. 12 illustrates a storage system 1200 which implements high level (e.g., SSD) storage tiers in combination with lower level (e.g., magnetic tape) storage tiers, according to one embodiment. Note that some of the elements shown in FIG. 12 may be implemented as hardware and/or software, according to various embodiments. The storage system 1200 may include a storage system manager 1212 for communicating with a plurality of media on at least one higher storage tier 1202 and at least one lower storage tier 1206. However, in other approaches, a storage system manager 1212 may communicate with a plurality of media on at least one higher storage tier 1202, but no lower storage tier. The higher storage tier(s) 1202 preferably may include one or more random access and/or direct access media 1204, such as hard disks, NVM, NVRAM, solid state memory in SSDs, MRAM, SSD arrays, flash memory arrays, etc., and/or others noted herein or known in the art. According to illustrative examples, FIGS. 3-4 show exemplary architectures of SSD systems which may be used as a higher storage tier 1202 depending on the desired embodiment.

Referring still to FIG. 12, the lower storage tier(s) 1206 preferably includes one or more lower performing storage media 1208, including sequential access media such as magnetic tape in tape drives and/or optical media, slower accessing HDDs, slower accessing SSDs, etc., and/or others noted herein or known in the art. One or more additional storage tiers 1216 may include any combination of storage memory media as desired by a designer of the system 1200. Thus, the one or more additional storage tiers 1216 may, in some approaches, include a SSD system architecture similar or the same as those illustrated in FIGS. 1-2. Also, any of the higher storage tiers 1202 and/or the lower storage tiers 1206 may include any combination of storage devices and/or storage media.

The storage system manager 1212 may communicate with the storage media 1204, 1208 on the higher storage tier(s) 1202 and lower storage tier(s) 1206 through a network 1210, such as a storage area network (SAN), as shown in FIG. 12, or some other suitable network type. The storage system manager 1212 may also communicate with one or more host systems (not shown) through a host interface 1214, which may or may not be a part of the storage system manager 1212. The storage system manager 1212 and/or any other component of the storage system 1200 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1200 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1202, may include a majority of SSD storage media for storing data in a higher performing storage environment, and remaining storage tiers, including lower storage tier 1206 and additional storage tiers 1216 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1202, while data not having one of these attributes may be stored to the additional storage tiers 1216, including lower storage tier 1206. Of course, one of skill in the art, upon reading the present descriptions, may devise many other combinations of storage media types to implement into different storage schemes, according to the embodiments presented herein.

According to some embodiments, the storage system (such as 1200) may include logic configured to receive a request to open a data set, logic configured to determine if the requested data set is stored to a lower storage tier 1206 of a tiered data storage system 1200 in multiple associated portions, logic configured to move each associated portion of the requested data set to a higher storage tier 1202 of the tiered data storage system 1200, and logic configured to assemble the requested data set on the higher storage tier 1202 of the tiered data storage system 1200 from the associated portions.

Of course, this logic may be implemented as a method on any device and/or system or as a computer program product, according to various embodiments.

What is claimed is:

1. A computer-implemented method, comprising:
   determining a current temperature associated with an intended storage location in memory for data in a received write request;
   determining a percentage of first logical states included in a binary representation of the data in the received write request;
   selecting a write management operation in response to determining that the current temperature associated with the intended storage location is outside a predetermined range, wherein the write management operation corresponds to the determined percentage of first logical states included in the binary representation; and
   sending one or more instructions to perform the write management operation.

2. The computer-implemented method of claim 1, wherein the write management operation is selected from a group consisting of: delaying the received write request, prioritizing read requests over the received write request, lowering a high water mark of a write queue, and discarding the received write request.

3. The computer-implemented method of claim 1, wherein the write management operation selected includes lowering a high water mark of a write queue in response to determining that the binary representation of the data includes less than or equal to x % first logical states, wherein the write management operation selected includes delaying the received write request in response to determining that the binary representation of the data includes less than or equal to y % first logical states, wherein the write management operation selected includes prioritizing read requests over the received write request in response to determining that the binary representation of the data includes greater than y % first logical states, wherein the write management operation selected includes discarding the received write request in response to determining that the binary representation of the data includes greater than or equal to z % first logical states, wherein x %<y %<z %.

4. The computer-implemented method of claim 3, wherein x=25, wherein y=75, wherein z=85.

5. The computer-implemented method of claim 1, wherein the memory includes a two-dimensional non-volatile memory array configuration.

6. The computer-implemented method of claim 1, wherein the memory includes a three-dimensional non-volatile memory array configuration.

7. The computer-implemented method of claim 1, wherein determining the current temperature associated with the intended storage location, and determining the percentage of first logical states included in the binary representation of the data in the received write request are performed in parallel.

8. The computer-implemented method of claim 1, wherein the method is performed by a hot write controller.

9. The computer-implemented method of claim 1, comprising:
determining whether an updated temperature associated with the intended storage location is outside the predetermined range; and
sending one or more instructions to perform the write request in response to determining that the current temperature associated with the intended storage location is not outside the predetermined range.

10. A computer program product comprising a computer readable storage medium having program instructions embodied therewith, the program instructions readable and/or executable by a controller to cause the controller to perform a method comprising:
determining, by the controller, a current temperature associated with an intended storage location in memory for data in a received write request;
determining, by the controller, a percentage of first logical states included in a binary representation of the data in the received write request;
selecting, by the controller, a write management operation in response to determining that the current temperature associated with the intended storage location is outside a predetermined range, wherein the write management operation corresponds to the determined percentage of first logical states included in the binary representation; and
sending, by the controller, one or more instructions to perform the write management operation.

11. The computer program product of claim 10, wherein the write management operation is selected from a group consisting of: delaying the received write request, prioritizing read requests over the received write request, lowering a high water mark of a write queue, and discarding the received write request.

12. The computer program product of claim 10, wherein the write management operation selected includes lowering a high water mark of a write queue in response to determining that the binary representation of the data includes less than or equal to x % first logical states, wherein the write management operation selected includes delaying the received write request in response to determining that the binary representation of the data includes less than or equal to y % first logical states, wherein the write management operation selected includes prioritizing read requests over the received write request in response to determining that the binary representation of the data includes greater than y % first logical states, wherein the write management operation selected includes discarding the received write request in response to determining that the binary representation of the data includes greater than or equal to z % first logical states, wherein x %<y %<z %.

13. The computer program product of claim 12, wherein x=25, wherein y=75, wherein z=85.

14. The computer program product of claim 10, wherein the memory includes a two-dimensional non-volatile memory array configuration.

15. The computer program product of claim 10, wherein the memory includes a three-dimensional non-volatile memory array configuration.

16. The computer program product of claim 10, wherein determining the current temperature associated with the intended storage location, and determining the percentage of first logical states included in the binary representation of the data in the received write request are performed in parallel.

17. The computer program product of claim 10, wherein the method is performed by a hot write controller.

18. The computer program product of claim 10, the program instructions readable and/or executable by the controller to cause the controller to perform the method comprising:
determining, by the controller, whether an updated temperature associated with the intended storage location is outside the predetermined range; and
sending, by the controller, one or more instructions to perform the write request in response to determining that the current temperature associated with the intended storage location is not outside the predetermined range.

19. A system, comprising:
a processor; and
logic integrated with the processor, executable by the processor, or integrated with and executable by the processor, the logic being configured to:
determine, by the processor, a current temperature associated with an intended storage location in memory for data in a received write request;
determine, by the processor, a percentage of first logical states included in a binary representation of the data in the received write request;
select, by the processor, a write management operation in response to determining that the current temperature associated with the intended storage location is outside a predetermined range, wherein the write management operation corresponds to the determined percentage of first logical states included in the binary representation; and
send, by the processor, one or more instructions to perform the write management operation.

20. The system of claim 19, the logic being configured to:
determine, by the processor, whether an updated temperature associated with the intended storage location is outside the predetermined range; and
send, by the processor, one or more instructions to perform the write request in response to determining that the current temperature associated with the intended storage location is not outside the predetermined range.

* * * * *